(12) United States Patent  
Sugihara et al.

(10) Patent No.: US 9,720,301 B2  
(45) Date of Patent: Aug. 1, 2017

(54) LASER LIGHT SOURCE APPARATUS AND TEMPERATURE CONTROL METHOD OF WAVELENGTH CONVERSION ELEMENT IN LASER LIGHT SOURCE APPARATUS

(75) Inventors: Nobuhiko Sugihara, Hyogo (JP); Kentaro Fujita, Hyogo (JP); Takanori Samejima, Hyogo (JP); Yoshihiro Horikawa, Hyogo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 30 days.

(21) Appl. No.: 14/241,432

(22) PCT Filed: Aug. 6, 2012

(86) PCT No.: PCT/JP2012/069967  
§ 371 (c)(1),  
(2), (4) Date: Apr. 8, 2014

(87) PCT Pub. No.: WO2013/031485  
PCT Pub. Date: Mar. 7, 2013

(65) Prior Publication Data  
US 2014/0233090 A1    Aug. 21, 2014

(30) Foreign Application Priority Data  
Aug. 26, 2011    (JP) ................................ 2011-184644

(51) Int. Cl.  
*G02F 1/37* (2006.01)  
*G02F 1/01* (2006.01)  
(Continued)

(52) U.S. Cl.  
CPC .............. *G02F 1/37* (2013.01); *G02F 1/0121* (2013.01); *G02F 1/353* (2013.01); *H01S 3/109* (2013.01);  
(Continued)

(58) Field of Classification Search  
CPC ........ G02F 1/37; H01S 3/1028; H01S 5/0092; H01S 5/0261; H01S 5/0607; H01S 5/0612  
See application file for complete search history.

(56) References Cited

U.S. PATENT DOCUMENTS 5,353,292 A * 10/1994 Motegi ........................... 372/21  
5,754,574 A     5/1998 Lofthouse-Zeis et al.  
(Continued)

FOREIGN PATENT DOCUMENTS

| | | |
|---|---|---|
| JP | H11-508408 A | 7/1999 |
| JP | 2000-261073 A | 9/2000 |

(Continued)

OTHER PUBLICATIONS

International Search Report for International Application, PCT/JP2012/069967, Sep. 4, 2012.

*Primary Examiner* — Daniel Petkovsek

(57) ABSTRACT

The purpose of the present invention is to make it possible to output stable light by optimizing the wavelength conversion efficiency in a wavelength conversion element without employing an optical detection device such as a photo diode in a laser light source device. A fundamental light wave emitted from a semiconductor laser (2) is wavelength converted by a wavelength conversion element (5) and is emitted therefrom. A lighting circuit (20) supplies electric power for the aforementioned semiconductor laser (2) to turn on the semiconductor laser (2). A control unit (21) controls the operation of the device while controlling the amount of power supplied to a heater means (7) such that the wavelength conversion element (5) reaches a temperature at which optimum wavelength conversion efficiency is acquired. The temperature detected by a temperature detection means (Th1) is input to the control unit (21), and the control unit (21) defines the temperature of the wavelength (Continued)

conversion element (5) at which the maximum amount of power is supplied to the heater means (7) as a set temperature at which the optimum wavelength conversion efficiency is acquired, and performs feedback control of the temperature of the wavelength conversion element (5) so that the temperature of the wavelength conversion element (5) reaches the aforementioned set temperature by controlling the amount of heat supplied from the heater means (7).

4 Claims, 15 Drawing Sheets

(51) Int. Cl.
  *G02F 1/35* (2006.01)
  *H01S 3/109* (2006.01)
  *H01S 5/14* (2006.01)
  H01S 5/022 (2006.01)
  H01S 5/024 (2006.01)
  H01S 5/042 (2006.01)
  H01S 5/0683 (2006.01)

(52) U.S. Cl.
  CPC .......... *H01S 5/141* (2013.01); *G02F 2201/17* (2013.01); *G02F 2203/21* (2013.01); *H01S 5/02296* (2013.01); *H01S 5/02446* (2013.01); *H01S 5/0428* (2013.01); *H01S 5/0683* (2013.01)

(56) References Cited

U.S. PATENT DOCUMENTS

| | | | | |
|---|---|---|---|---|
| 5,898,718 | A * | 4/1999 | Mohatt et al. | 372/22 |
| 5,936,987 | A * | 8/1999 | Ohishi | H01S 3/109 372/22 |
| 6,130,901 | A * | 10/2000 | Takamine | H01S 5/0687 372/22 |
| 6,584,127 | B2 * | 6/2003 | Matsumoto | H01S 3/042 372/34 |
| 7,855,830 | B2 * | 12/2010 | Inoue et al. | 359/326 |
| 7,899,105 | B1 * | 3/2011 | Hargis | H01S 5/146 372/102 |
| 8,199,396 | B2 * | 6/2012 | Kusukame et al. | 359/328 |
| 8,440,951 | B2 * | 5/2013 | Furuya et al. | 250/205 |
| 9,385,505 | B2 * | 7/2016 | Sugihara | G02F 1/37 |
| 2002/0009105 | A1 | 1/2002 | Matsumoto | |
| 2009/0014656 | A1 | 1/2009 | Stenton et al. | 250/352 |
| 2009/0154509 | A1 * | 6/2009 | Suzuki | B23K 26/0066 372/22 |

FOREIGN PATENT DOCUMENTS

| | | |
|---|---|---|
| JP | 2001-168439 A | 6/2001 |
| JP | 2003-298180 A | 10/2003 |
| JP | 2007-233039 A | 9/2007 |
| JP | 2009-054446 A | 3/2009 |

* cited by examiner

LASER LIGHT SOURCE APPARATUS AND TEMPERATURE CONTROL METHOD OF WAVELENGTH CONVERSION ELEMENT IN LASER LIGHT SOURCE APPARATUS

CROSS REFERENCE TO RELATED APPLICATIONS

This application is the National Stage of International Application No. PCT/JP2012/069967, filed Aug. 6, 2012, which claims priority to Japanese Patent Application No. 14/241,432.

TECHNICAL FIELD

The present invention relates to a wavelength conversion type laser light source apparatus using a nonlinear optical crystal. More particularly, it relates to a temperature control method of a wavelength conversion element, in a wavelength conversion type laser light source apparatus using a nonlinear optical crystal or in a laser light source apparatus, which carries out temperature control so that the conversion efficiency of a nonlinear optical crystal in the laser light source apparatus may be maximized.

BACKGROUND ART

Apparatuses using laser light as a light source of a projection type projector, which is used for a movie or home theater, have been developed. In such a laser light source which serves as a light source, it is known that there are a case where light emitted directly from a semiconductor laser element is used, and a case where the wavelength of light emitted from the semiconductor laser element is converted to wavelength different therefrom by a nonlinear optical crystal in order to use the light. In recent years, laser light sources have been developed as blue or green laser light sources in which Periodically Poled Lithium Niobate (PPLN: Periodically Poled Lithium Niobate), or Periodically Poled Lithium Tantalate (PPLT: Periodically Poled Lithium Tantalate), etc. is used for such a nonlinear optical crystal. For example, what is disclosed in Patent Literature Document 1 is known as such technology. The Patent Documents 1 discloses that a laser light source apparatus comprises a light source, which is made up of a semiconductor laser; a wavelength conversion element (which is a nonlinear optical crystal, for example, PPLN) which receives and converts laser light emitted from the light source, into second harmonics; and an external resonator which chooses light of predetermined wavelength emitted from the wavelength conversion element, and which reflects it toward the light source (for example, volume bragg grating: VBG: Volume Bragg Grating). Moreover, it discloses that a temperature adjusting unit is provided between the wavelength conversion element and a subbase to which the wavelength conversion element is attached. Furthermore, it discloses that since an interval of a polarization reversal cycle of a wavelength conversion element can be adjusted by adjusting the temperature of the wavelength conversion element using the temperature adjusting unit, it becomes possible to improve the light conversion efficiency.

FIG. 16 is a block diagram showing one form of a conventional laser light source apparatus, and explanation of the prior art in which the temperature of a wavelength conversion element is set as the optimal temperature, will be given referring to the figure. A wavelength conversion element 5 (for example, PPLN) mounted on a laser light source unit LH has a function to perform wavelength conversion for converting the wavelength of light emitted from the laser light source element 2 (which, is, for example, a semiconductor laser, and which will be referred to as a semiconductor laser) into wavelength shorter than that of the incidence light, and for example, infrared rays can be converted into green light. In addition, there is the optimal temperature of the wavelength conversion element 5 (for example, PPLN) at which the optical conversion efficiency can be maximized. Moreover, as for this optimal temperature, there is a variation depending on individual pieces, and if the temperature shifts from the optimal point by 0.5 degrees Celsius, the conversion efficiency will get worse by 10% or more. Light, which is not converted, is consumed as heat as it is. Then, in general, optimal temperature conditions of the wavelength conversion element are looked for, and if the optimal temperature conditions are found, the temperature of the wavelength conversion element 5 is detected by a temperature detection unit Th1, whereby control is performed so that the temperature of the wavelength conversion element 5 may become the optimal temperature by controlling a heating unit, for example, the heater 7, for heating the wavelength conversion element 5 from the outside, by a temperature adjusting unit.

In order to find the optimal control temperature of the wavelength conversion element 5, conventionally, for example, a method described below has been used. While driving the laser light source unit LH by a laser light source lighting apparatus 100 and sweeping control temperature of the wavelength conversion element 5 in an assumed temperature range, as shown in FIG. 16, for example, a light output measuring apparatus 110 such as a photo cell or an optical power meter, is used to measure light output emitted from the laser light source unit. And the control temperature, which is the maximum in light output when the sweeping measurement is completed, is saved, and this value is adopted as the optimal control temperature, whereby the temperature of the wavelength conversion element is controlled so as to become the optimal control temperature. However, in this method, a unit for measuring light output is needed so that there is a problem that unnecessary cost incurs.

A block diagram of another configuration example of a conventional laser light source apparatus is shown in FIG. 17. This example is a configuration example in case where a laser is in series connected. As shown in FIG. 17, for the purpose of the cost cut of the laser light source apparatus, a method of connecting, in series, two or more semiconductor lasers 2 to each other in one laser light source lighting apparatus 100 is known widely. In this form, because a switching element, a control circuit, etc. in the laser light source lighting apparatus 100 can be shared, a lighting power source can be cheaply supplied. Moreover, it is configured so that three lights outputted from respective laser light source units LH1-LH3 are condensed by using an optical element PZs such as prisms, thereby emitting light. As described above, when the two or more laser elements are used, adjustment of the optimal temperature of each wavelength conversion element 5 is individually needed, so that there is a problem that it takes a lot of time to perform the adjustments. That is, in measurement in which a photo cell shown in FIG. 16 is used, only one laser light source unit LH is measured and the optimal temperature of the laser light source unit which is subject thereto is adjusted. However, as shown in the figure, when the laser light source units LH1-LH3 are in series connected, it is impossible to stop only one laser since the same current flows through the three lasers, so that it is difficult to adjust the optimal temperature of the wavelength conversion element 5.

PRIOR ART

Patent Literature Documents

Patent Literature Document 1: Japanese Patent Application Publication No. 2009-54446

SUMMARY OF THE INVENTION

Technical Problem

As mentioned above, when the temperature of the wavelength conversion element is adjusted by the temperature adjusting unit, as shown in FIG. 16, it is necessary to use a light detecting device such as a photo diode in order to monitor a light output. Therefore, there is a problem that calibration and replacement of the light detecting device itself is needed due to lifetime or degradation. Furthermore, there is a problem that if this light detecting device is installed in this laser light source apparatus, the apparatus becomes complicated and enlarged as a whole. Moreover, when two or more laser elements are used, adjustments of the optimal temperature of the wavelength conversion element are respectively needed, so that there is also a problem that it takes a lot of time. Furthermore, as shown in FIG. 17, when two or more laser elements are in series arranged and turned on simultaneously, there are problems that lights from the laser elements, which adjoin to each other, becomes ambient lights, so that light intensity thereof cannot be correctly measured, and the temperature, at which the conversion efficiency of light of the wavelength conversion element becomes optimal, cannot be detected. Moreover, since operation temperature of the wavelength conversion element changes depending on the surrounding environment, the conversion efficiency of the wavelength conversion element changes, and further since the wavelength of the semiconductor laser light source, in which wavelength thereof is converted by the wavelength conversion element, changes due to change of the surrounding environment, there is a problem that the conversion efficiency of this wavelength conversion element changes so that a stable light output cannot be not obtained. The present invention solves the above-mentioned problem, and the subject of the present invention is to offer a laser light source apparatus, in which the wavelength conversion efficiency of a wavelength conversion element is optimized without using a light detecting device such as a photo diode, whereby the stable light can be output.

Solution to Problem

In the present invention, in order to solve the above-mentioned problem, a laser light source apparatus, comprises: a semiconductor laser; a lightning circuit which lights the semiconductor laser; a wavelength conversion element which performs wavelength conversion of laser light emitted from the semiconductor laser; a detection unit which detects temperature of the wavelength conversion element; a heating unit which heats the wavelength conversion element; a control unit which controls the lightning circuit and the heating unit; and a temperature control unit which controls the amount of electric power supplied to the heating unit based on a difference of the temperature detected by the detection unit and setting temperature, and controls the temperature of the wavelength conversion element so as to turn into the setting temperature, wherein when the laser light is emitted onto the wavelength conversion element, the setting temperature is swept within a range including a target temperature to be controlled, and an amount of electric power applied to the heating unit is measured, so that temperature at which the amount of electric power supply turns into a maximum, is obtained, thereby setting the temperature as optimal setting temperature. And the amount of electric power supplied to the heating unit is controlled so that the wavelength conversion unit may turn into the optimal setting temperature. Moreover, the optimal setting temperature may be periodically updated by using the predetermined conditions (ambient temperature, temperature near the semiconductor laser, and condition of electric power to be supplied to the semiconductor laser etc.) as parameters. The above-mentioned optimal setting temperature according to a preset expression (or table) may be updated, depending on, for example, the temperature of the laser joint part depending on the laser current of the semiconductor laser, and change of the temperature near the laser which indicates the temperature of a base wave light reflecting element (VBG). In view of the above, a subject set forth below is solved by the present invention.

(1) In laser light source apparatus comprising a semiconductor laser; a lightning circuit, which lights this semiconductor laser; a wavelength conversion element which carries out wavelength conversion of laser light emitted from this semiconductor laser; a detection unit which detects the temperature of this wavelength conversion element; a heating unit which heats the wavelength conversion element; a control unit which controls the lightning circuit and the heating unit, wherein the control unit has a temperature control unit which controls the amount of electric power supplied to the heating unit based on a difference between the temperature detected by the detection unit and setting temperature, and which performs control so that the temperature of the wavelength conversion element turns into the setting temperature; and an optimal temperature setting unit which measures the amount of electric power supplied to the heating unit at each setting temperature while changing the setting temperature when the wavelength conversion element is irradiated with laser light, which obtains the temperature at which the amount of electric power supply turns into the maximum, thereby regarding this temperature as the optimal setting temperature so that the setting temperature is set as the optimal setting temperature.

(2) In a laser light source apparatus comprising a semiconductor laser, a lightning circuit, which lights this semiconductor laser; a wavelength conversion element which carries out wavelength conversion of laser light emitted from this semiconductor laser; a detection unit which detects temperature of this wavelength conversion element; a heating unit which heats the wavelength conversion element; an apparatus temperature detection unit which detects the temperature of the semiconductor laser or that of neighborhood thereof, a control unit which controls the lightning circuit and the heating unit, wherein the control unit has a temperature control unit which controls an output to the heating unit based on a difference between the temperature detected by the detection unit and setting temperature, and which performs control so that the temperature of a wavelength conversion element turns into the setting temperature; and an optimal temperature sequential setting unit, which changes the setting temperature when the wavelength conversion element is irradiated with laser light at certain apparatus temperature; which measures the amount of electric power supplied to the heating unit at each setting temperature; which obtains temperature at which the amount of electric power supply turns into the maximum; which sets this temperature as first optimal setting temperature at the apparatus temperature; which calculates a setting temperature compensation amount with respect to this optimal setting temperature, by using the apparatus temperature and/or condition of electric power applied to the laser, as a parameter; and which sequentially and periodically corrects the setting temperature to this optimal setting temperature.

(3) A method for controlling temperature of the wavelength conversion unit in laser light source apparatus comprising a semiconductor laser; a lightning circuit, which lights this semiconductor laser; a wavelength conversion element which carries out wavelength conversion of laser light emitted from this semiconductor laser; a detection unit which detects the temperature of this wavelength conversion element; and a heating unit which heats the wavelength conversion element, wherein the amount of electric power supplied to the heating unit is controlled based on a difference of the temperature detected by the detection unit and setting temperature, and control is performed so that temperature of the wavelength conversion element may turn into the setting temperature, comprising the following steps of: a first step of measuring the amount of electric power supplied to the heating unit at each setting temperature while changing the setting temperature when the wavelength conversion element is irradiated with laser light, and obtaining temperature at which the amount of electric power supply turns into a maximum, thereby setting the temperature as optimal setting temperature; a second step of setting the setting temperature as the optimal setting temperature; and a third step of controlling the amount of electric power supplied to the heater so that the temperature of the wavelength conversion element may turn into the optimal setting temperature.

(4) A method for controlling temperature of the wavelength conversion unit in a laser light source apparatus comprising a semiconductor laser; a lightning circuit, which lights this semiconductor laser; a wavelength conversion element which carries out wavelength conversion of laser light emitted from this semiconductor laser; a detection unit which detects the temperature of this wavelength conversion element; and a heating unit which heats the wavelength conversion element; the amount of electric power supplied to the heating unit is controlled based on a difference of the temperature detected by the detection unit and setting temperature, and control is performed so that the temperature of the wavelength conversion element may turn into the setting temperature, comprising the following steps of: a first step of detecting apparatus temperature which is the temperature of the semiconductor laser or that of neighborhood thereof; and measuring the amount of electric power supplied to the heating unit at each setting temperature while changing the setting temperature when the wavelength conversion element is irradiated with laser light, obtaining temperature at which the amount of electric power supply turns into a maximum, thereby setting the temperature as first optimal setting temperature in the apparatus temperature, calculating a setting temperature compensation amount by using, as a parameter, electric power conditions added to apparatus temperature or laser at different apparatus temperature; a second step of sequentially and periodically changing the setting temperature to this optimal setting temperature; and a third step of controlling the amount of electric power supplied to the heater so that the temperature of the wavelength conversion element may turn into the optimal setting temperature.

Advantageous Effects of Invention

The following effects can be acquired in the present invention.

(1) Even if a light detecting device such as a photo-diode is not used, it becomes possible to control the temperature of a wavelength conversion element so as to become temperature at which the optimal wavelength conversion efficiency is acquired, by detecting the amount of electric power supplied to the heating unit which controls the temperature of the wavelength conversion element, whereby a stable optical output can be obtained. Moreover, since it is not necessary to use light detecting device such as a photo diode, it is possible to acquire an effect that no calibration etc. is needed. Moreover, in case of two or more laser light source units, it is possible to simultaneously set up the optimal temperature of the wavelength conversion element at which the optimal wavelength conversion efficiency can be obtained, so that it is possible to greatly reduce working hours.

(2) Apparatus temperature or optimal temperature of a wavelength conversion element with respect to electric power conditions to the semiconductor laser is obtained, whereby a setting temperature compensation amount is obtained by using apparatus temperature and/or condition of electric power applied to the laser, as a parameter, and the setting temperature is sequentially and periodically changed to the optimal setting temperature, and a feedback control is performed so that the temperature of the wavelength conversion element turns into this setting temperature, whereby even during an operation of the apparatus etc., it is possible to always and easily maintain the temperature of the wavelength conversion element at the optimal temperature. For this reason, it is possible to stably obtain a high optical conversion action, and an apparatus having high efficiency can be offered at low cost as a whole.

DESCRIPTION OF EMBODIMENTS

Figure 1:
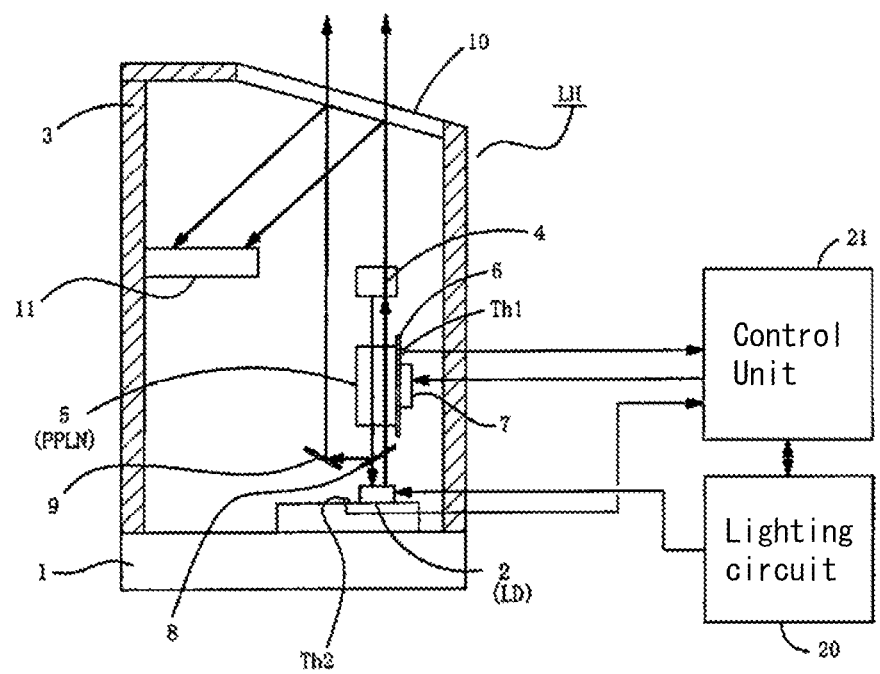
FIG. 1 is a diagram showing the structure of a laser light source apparatus according to an embodiment of the present invention.

FIG. 1 is a diagram showing the structure of a laser light source apparatus according to an embodiment of the present invention. As shown in FIG. 1, the laser light source apparatus has a laser light source unit LH, a lightning circuit 20 for lighting a semiconductor laser and a control unit 21. In the laser light source unit LH, a shielding container 3 (for example, made from aluminum), which prevents a leakage of laser light, which shields components housed thereinside from the outside air or dust, and which performs heat insulation, is attached to a substrate 1 which serves as a base plate (heatsink) and which is made of material having high-thermal conductance, for example, copper (Cu). A semiconductor laser 2 which emits infrared light as a fundamental wave light is provided on the substrate 1 in the shielding container 3. The semiconductor laser 2 is an external resonator type surface-emitting laser array which emits 1064 nm. An apparatus temperature detection unit Th2 (for example, a thermistor) which detects the temperature of the semiconductor laser, is provided on the substrate 1 near this semiconductor laser 2.

A base wave light reflecting element 4 (for example, the above-mentioned VBG), which reflects light of specific narrow wavelength band of the fundamental wave light with high reflectance (for example, 99.5%), is arranged at a position so as to face the semiconductor laser 2, and forms an external resonator with respect to the semiconductor laser 2. In addition, the base wave light reflecting element 4 transmits conversion light. Moreover, a wavelength conversion element 5 (for example, the above-mentioned PPLN), which changes part of light (which is phase-matched wavelength light in wavelengths of fundamental wave light, thereby forming wavelength conversion light (second harmonic wave: SHG), and whose phase matching temperature is 80 degrees Celsius to 100 degrees Celsius), is arranged between the semiconductor laser 2 and the base wave light reflecting element 4. A heat exchanger plate 6 is arranged on and is brought thermally in contact with the wavelength conversion element 5, and a heating unit 7 (for example, heater), which is means for heating the wavelength conversion element 5, and a temperature detection unit Th1 (for example, a thermistor), which detects the temperature of the wavelength conversion element 5, are provided on the heat exchanger plate 6.

A dichroic output mirror 10 is provided on a surface facing the substrate 1 of the shielding container 3, wherein the wavelength conversion light outputted by passing through the base wave light reflecting element 4 is emitted from this dichroic output mirror 10. The dichroic output mirror 10 reflects the fundamental wave light, which is not reflected by but passes through the base wave light reflecting element 4. The fundamental wave light reflected by the dichroic output mirror 10 enters a beam dump 11 (for example, black-colored-alumite treated aluminium plate), and is absorbed therein. The beam dump 11 is thermally in contact with the shielding container 3. Moreover, a dichroic mirror 8, through which the fundamental wave light passes, and by which the wavelength conversion light is reflected and taken out in a transverse direction, is provided between the semiconductor laser 2 and the wavelength conversion elements 5, wherein the wavelength conversion light reflected by this dichroic mirror 8 is reflected by the reflective mirror 9 in the same direction as that of the wavelength conversion light which passes through the base wave light reflecting element 4, and passes through the dichroic output mirror 10 and is emitted therefrom. That is, the laser light source apparatus to which the present invention is applied comprises the wavelength conversion element 5 which carries out wavelength conversion of the fundamental wave light emitted from the semiconductor laser 2, and the base wave light reflecting element 4 (for example, VBG), which is arranged at a light emission side of the wavelength conversion element 5; which reflects, with high reflectance, light of the specific narrow wavelength band of the fundamental wave light among the lights emitted from this wavelength conversion element 5; and which constitutes an external resonator with respect to the semiconductor laser 2. In addition, although a holding member for holding each component, etc. are provided, they are not illustrated in the figures.

In FIG. 1, the fundamental wave light emitted from the semiconductor laser 2 enters the wavelength conversion element 5 through the dichroic mirror 8, as shown in an arrow of the figure. Wavelength conversion of part of the light which enters the wavelength conversion element 5 is carried out, and this wavelength-converted light passes through the base wave light reflecting element 4, and is emitted through the dichroic output mirror 10. Moreover, the fundamental wave light whose wavelength is not converted by the wavelength conversion element 5 is reflected by the base wave light reflecting element 4 and enters the wavelength conversion element 5, and wavelength conversion is carried out by the wavelength conversion element 5. This light whose wavelength has been converted is reflected by the dichroic mirror 8 and emitted through the reflective mirror 9 and the dichroic output mirror 10. Moreover, the fundamental wave light, which has not been converted in wavelength by the wavelength conversion element 5 and which enters the dichroic mirror 8, passes through the dichroic mirror 8, and enters the semiconductor laser 2. On the other hand, the fundamental wave light which passes through the base wave light reflecting element 4 without reflection by this element, and the fundamental wave light which is reflected without passing through the dichroic mirror 8, and which is reflected by the reflective mirror 9, are reflected by the dichroic output mirror 10, as shown in arrows of the figure, and enters the beam dump 11 thereby being absorbed.

As the wavelength conversion element 5, lithium niobate (LiNbO$_3$) having a periodic polarization reversal structure, lithium niobate in which magnesium is doped (MgO:LiNbO$_3$), lithium tantalum niobate (LiTaNbO$_3$), lithium tantalate (LiTaO$_3$), or potassium titanyl phosphate (KTiOPO$_4$) etc. can be used. In general, a quasi phase matching type wavelength conversion element, which is called periodically poled lithium niobate (PPLN), periodically poled magnesium doped lithium niobate (PPMgLN), periodically poled lithium tantalate (PPLT), or periodically poled potassium titanyl phosphate (PPKTP) can be used.

As shown in FIG. 1, the control unit 21 and the lightning circuit 20 are provided in the light source apparatus according to this embodiment. The lightning circuit 20 supplies pulse-like electric power to the semiconductor laser 2, thereby lighting the semiconductor laser 2. While the control unit 21, for example, controls the lightning circuit 20 thereby controlling an operation of the laser light source apparatus, control is performed so that the temperature of the wavelength conversion element 5 turns into temperature at which the wavelength conversion element 5 has optimal wavelength conversion efficiency by controlling the temperature of the wavelength conversion element 5. That is, the temperature of the wavelength conversion element 5 detected by the temperature detection unit Th1 is inputted into the control unit 21, and the control unit 21 regards the temperature of the wavelength conversion element at time when the amount of electric power supplied to the heating unit 7 turns into the maximum, as described below, as an optimal setting temperature of the wavelength conversion element, whereby feedback control of the temperature of the wavelength conversion element 5 is carried out so that the temperature of the wavelength conversion element 5 may turn into the optimal setting temperature, by controlling the amount of heating by the heating unit 7 (a first embodiment described below). Moreover, as described below, the control unit 21 obtains the optimal setting temperature of the wavelength conversion element 5 based on the apparatus temperature detected by apparatus temperature detection unit Th2 which detects the temperature of the semiconductor laser 2, and conditions of the electric power applied to the semiconductor laser 2, etc., thereby controlling the temperature of the wavelength conversion element 5 (a second embodiment described below).

Figure 2:
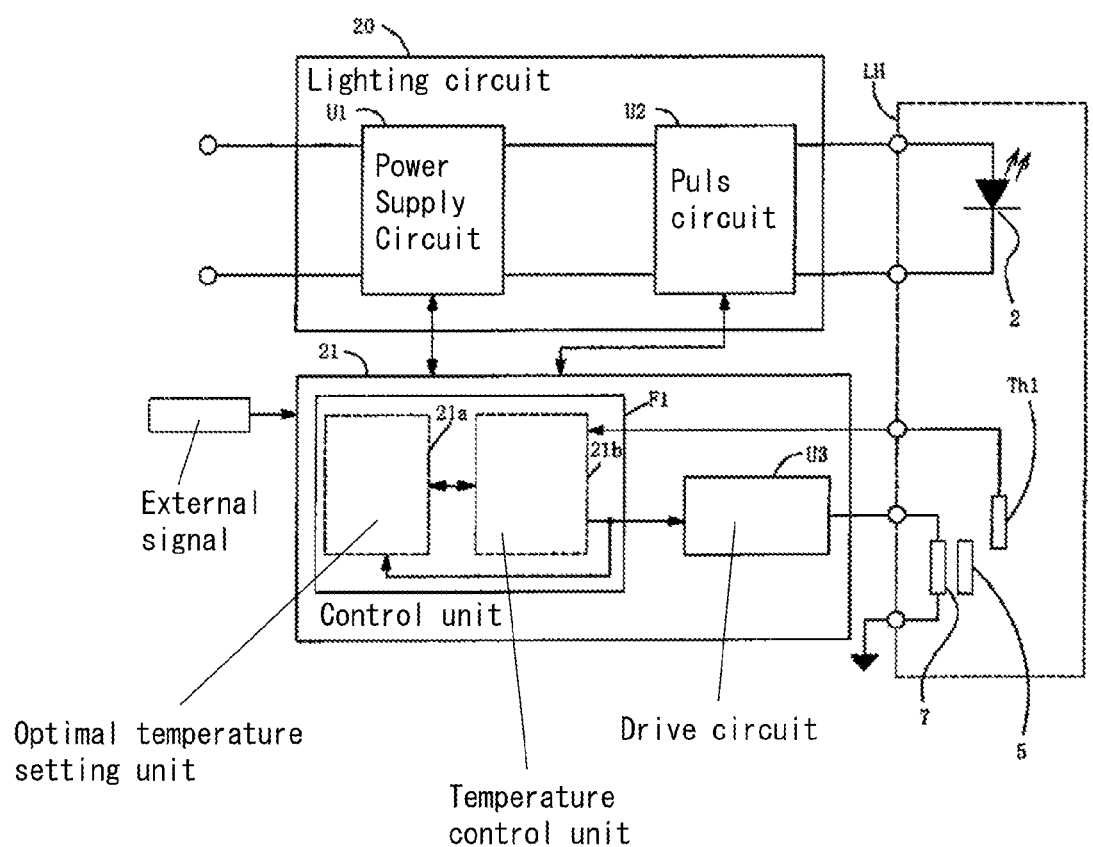
FIG. 2 It is a block diagram showing the structure of a control unit and a lighting circuit in a laser light source apparatus according to a first embodiment of the present invention.

FIG. 2 is a block diagram showing the structure of the control unit and the lighting circuit in the laser light source apparatus according to a first embodiment of the present invention. The lightning circuit 20 comprises, as shown in the figure, an electric power supply circuit U1, which is represented by a step-down chopper and a boost chopper or which is formed from another type of switching circuit etc.; and a pulse circuits U2 which supplies pulse-like electric power, wherein suitable voltage and current are outputted to the semiconductor laser 2 according to a state or lighting sequence of the semiconductor laser 2. A system, which impresses pulse voltage in a rectangle wave shape at approximately hundreds kHz to the laser, depending on a kind of the laser, is known well. In the present embodiment, the pulse circuit U2 is arranged in the output side of the electric power supply circuit U1, and generates a pulse at desired frequency, so as to output it to the semiconductor laser 2. In addition, it is not limited thereto in case of a different kind of laser, which is different from the above, and except the pulse circuit U2, the output voltage from the electric power supply circuit U1 may be impressed to the laser light source which directly corresponds to the semiconductor laser 2.

The semiconductor laser 2 shown in the present embodiment emits infrared rays, and has the wavelength conversion element 5 (for example, PPLN), which is an element for converting wavelength, in order to make conversion into visible light. This wavelength conversion element 5 has a feature in which quasi phase matching is carried out so as to raise the optical conversion efficiency, by raising it to predetermined temperature, and thus very accurate temperature control is needed. Therefore, the laser light source unit LH also has the wavelength conversion element 5 and the heating unit 7 (hereafter explained as a heater 7) for raising the temperature, and the temperature detection unit Th1 which detects the temperature of the heater 7, for example, a thermistor, is arranged.

Moreover, the control unit 21 is made up of a drive circuit U3 which drives a control means F1 and the heater 7. The electric power supply circuit U1 is controlled so that voltage impressed to the semiconductor laser 2 and current to be passed therethrough may turn into a preset value or a value set up from the outside, by the control means F1 which consists of an arithmetic processing unit (a CPU or a microprocessor). Moreover, start or stop of the electric power supply etc. is controlled thereby. Moreover, the pulse circuit U2 is controlled by the control means F1. The control means F1 determines optimal pulse frequency and a duty cycle ratio for acquiring high optical power efficiency, turns on and off the switching element of the pulse circuit U2 according to the values, and generates a pulse output which drives the semiconductor laser 2. The control means F1 is equipped with an optimal temperature setting unit 21a and a temperature control unit 21b. The temperature control unit 21b controls the amount of electric power supplied to the heater 7 based on a difference between the temperature detected by the temperature detection unit Th1 and the preset temperature set up by the optimal temperature setting unit 21a, thereby performing control so that the temperature of the wavelength conversion element turns into the setting temperature. The optimal temperature setting unit 21a measures the amount of electric power supplied to the heater 7 at each setting temperature, while changing the setting temperature, when the wavelength conversion element 5 is irradiated with the laser light, thereby obtaining temperature at which the maximum amount of electric power is supplied, and regarding this temperature as optimal setting temperature, and the above-mentioned setting temperature is set as the optimal setting temperature. That is, the temperature control unit 21b of the control means F1 drives the drive circuit U3 so as to control the amount of electric power supplied to the heater 7, whereby feedback control is carried out so that the temperature of the wavelength conversion element 5 detected by temperature detection unit Th1 may turn into the optimal setting temperature. Specifically, in order to control the amount of electric power supplied to the heater 7, the control means F1 sends out a signal, which indicates the amount of electric power supply, to the drive circuit U3. The drive circuit U3 drives the heater 7, and feedback control is carried out so that the temperature of the wavelength conversion element 5 may turn into the optimal setting temperature. The output of the drive circuit U3 may be in form of an output of a voltage level, or may be in form of the controlled electric power supply amount by using a PWM system.

Figure 3:
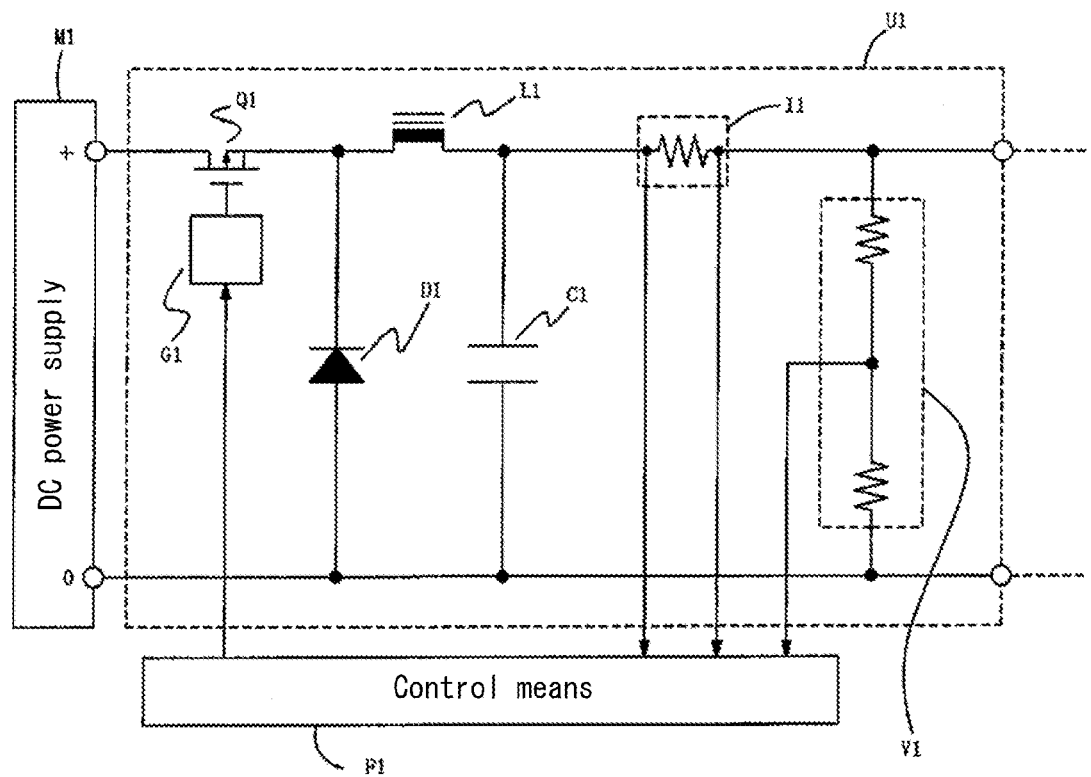
FIG. 3 It is a diagram showing a configuration example in which a power supply circuit is realized.

FIG. 3 is a diagram showing a configuration example in which a power supply circuit U1 used for the lighting circuit 20 in the laser light source apparatus is realized. The electric power supply circuit U1, which is based on a step-down chopper circuit, operates in response to a supply of voltage from a DC power supply M1, and performs adjustment of the amount of electric power supplied to the semiconductor laser 2. The electric power supply circuit U1 is configured so that the control means F1 drives a switching element Q1 such as an FET so that current from the DC power supply M1 is turned on and off thereby charging a smoothing capacitor C1 through a choke coil L1, and current is supplied to the semiconductor laser 2. In addition, during a period in which the switching element Q1 is in an ON state, while direct charge to the smoothing capacitor C1 and current supply to the semiconductor laser 2 which is a load, is performed, energy is stored in the choke coil L1 in form of magnetic flux, by current which passes through the switching element Q1. During a period in which the switching element Q1 is in an OFF state, by energy which is stored in the choke coil L1 in form of magnetic flux, charge to the smoothing capacitor C1 and current supply to the semiconductor laser 2 is performed through a flywheel diode D1. In addition, the halt condition of the electric power supply circuit U1 previously explained in relation to FIG. 2 refers to a state where the switching element Q1 is stopping in an OFF state.

In the step-down chopper type electric power supply circuit U1, the amount of electric power supplied to the semiconductor laser 2 can be adjusted according to a duty cycle ratio which is a ratio of a period during which the switching element Q1 is in an ON state, to an operation cycle of the switching element Q1. Here, a gate drive signal, which has a certain duty cycle, is generated by the control means F1, so that ON and OFF of the current from the DC power supply is controlled by controlling a gate terminal of the switching element Q1 through a gate drive circuit G1. It is configured so that the current and voltage to the semiconductor laser 2 can be detected by the electric power supply current detection unit I1 and the electric power supply voltage detection unit V1, respectively. In addition, the electric power supply current detection unit I1 can be easily realized by using a shunt resistor, and the electric power supply voltage detection unit V1 can be realized by using a voltage dividing resistors.

An electric power supply current detection signal from the electric power supply current detection unit I1 and an electric power supply voltage detection signal from the electric power supply voltage detection unit V1 are inputted into the control means F1, whereby the control means F1 outputs the gate drive signal in order to carry out on-off control of the switching element Q1, and carries out feedback control so that target current may be outputted. Therefore, it is possible to supply suitable electric power or current to the laser.

Figure 4:
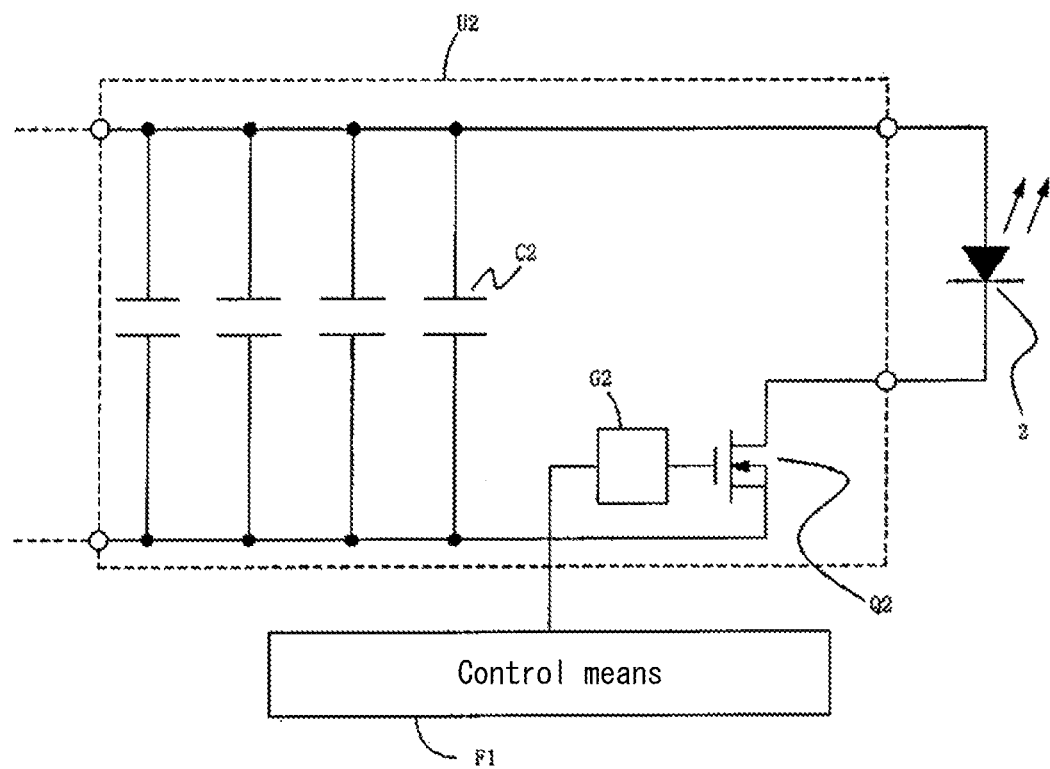
FIG. 4 It is a diagram showing a schematic configuration example of a pulse circuit.

FIG. 4 is a diagram showing a schematic configuration example of a pulse circuit U2 which can be used for the lighting circuit 20 in the laser light source apparatus according to the present invention. The pulse circuit U2 is configured by a circuit in which a switching element Q2 such as an FET is used. The switching element Q2 is driven according to a signal generated by the control means F1 through the gate drive circuit G2. An ON and OFF operation of the switching element Q2 is repeated at a high speed, and every time it is turned ON, electric power is supplied to the semiconductor laser 2 through this switching element Q2 from a capacitor group C2 charged by an output of the electric power supply circuit U1.

For example, in a system in which pulse voltage in rectangle wave shape is impressed to a laser at approximately hundreds of kHz, a joint part temperature (junction temperature) in a semiconductor device, for example, a laser diode in a pulse drive system can be lowered more than that in case of a simple DC drive. As a result, it is effective in raising the efficiency of optical output. If DC drive of the laser diode is carried out, since forward direction voltage in general drops compared with that in case of a pulse drive, and if electric power, which is comparable in size, is supplied to the laser diode, it is necessary to increase supply of current. This is because a loss due to a rise of current increases as a result and the temperature of a junction increases. In any event, the control means F1 determines the optimal pulse frequency and the duty cycle ratio for acquiring higher optical output efficiency, whereby the semiconductor laser 2 may be driven according to the values. However, because of the cost balance, assuming that there is some deterioration of optical output efficiency, the pulse circuit U2 may be removed and the semiconductor laser 2 etc. may be DC-driven directly.

Figure 5:
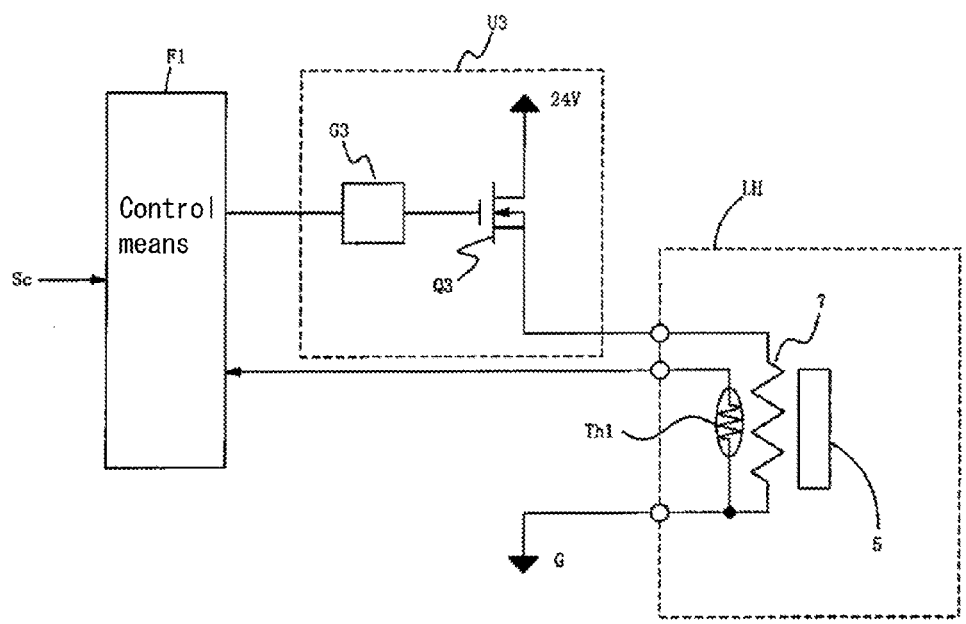
FIG. 5 It is a diagram showing a connecting relation of the structure of a drive circuit, a control unit, a heater, etc.

FIG. 5 is a diagram of a schematic configuration example showing a connecting relation of the drive circuit U3, the control means F1, and the wavelength conversion element, etc. in the laser light source apparatus according to the present invention. The laser light source unit LH has the wavelength conversion element 5, wherein there are condition(s) where optical power is maximized, that is, the efficiency of light wavelength conversion becomes highest. The condition is the temperature of the wavelength conversion element 5, and high conversion efficiency can be acquired by giving suitable temperature conditions thereto. Therefore, it is necessary to provide mechanism, in which the wavelength conversion element 5 is adjusted in the optimal temperature by raising the temperature of the wavelength conversion element 5 from the outside. Therefore, the heater 7 is provided adjacent to the wavelength conversion element 5, and it becomes important to control the heater 7 so that the temperature of the wavelength conversion element 5 may turn into optimal temperature.

The description of suitable temperature conditions of the wavelength conversion element 5 will be supplemented, below. Due to a manufacturing factor, the structure of the wavelength conversion element 5 or manufacturing reasons, the optimal values differ from one individual to the next, and for example, the temperature is approximately 80 degrees Celsius to 100 degrees Celsius, so that there is "variation" in approximately the same degree. As described above, the arithmetic processing unit (a CPU or a microprocessor) which forms the control means F1 needs to perform control to attain the optimal temperature conditions of the wavelength conversion element 5. In order to maintain the temperature of the wavelength conversion element 5 at desired constant temperature, the temperature of the heater 7 is indirectly controlled, so as to realize this. Therefore, the temperature detection unit Th1 is arranged on the heat exchanger plate 6 (refer to FIG. 1) near the heater 7.

As described above, the control means F1 has the optimal temperature setting unit 21a and the temperature control unit 21b, wherein the temperature control unit 21b of the control means F1 acquires the temperature information on the wavelength conversion element 5 by the temperature detection unit Th1. And the setting temperature set up by the optimal temperature setting unit 21a and the temperature detected by the temperature detection unit Th1 are compared with each other, so that feedback control of the amount of electric power supplied to the heater 7 is carried out. As to a form of a method of supplying electric power to the heater 7, a pulse signal of the PWM signal from the control means F1 is sent out to a gate terminal of the switching element Q3 through a gate drive circuit G3 of the drive circuit U3, so that ON-OFF control of this switching element Q3 is carried out. As a result, predetermined pulse voltage is supplied to the heater 7 at a predetermined cycle, for example, from the DC power supply of DC 24 V. Thus, the control means F1 controls the amount of electric power supply of the heater 7, whereby stable control is performed so that the wavelength conversion element 5 becomes the optimal temperature. In addition, it is necessary to obtain the optimal setting temperature of the wavelength conversion element 5 in the lightning circuit in advance. Therefore, there is also a method of setting the target temperature for controlling the heater 7 in a lighting electric power unit from the external signal Sc by serial communication etc. However, according to the present embodiment, as described below, when the wavelength conversion element is irradiated with laser light, the setting temperature is swept in a range including the target temperature to be controlled, and the amount of electric power supplied to the heating unit is measured, thereby obtaining the temperature at which the amount of electric power supply turns into the maximum, and setting this temperature as the optimal setting temperature. This target temperature information is written in and saved to a storage cell arranged in the control means F1, for example, an EEP ROM or a FLASH ROM.

Figure 6:
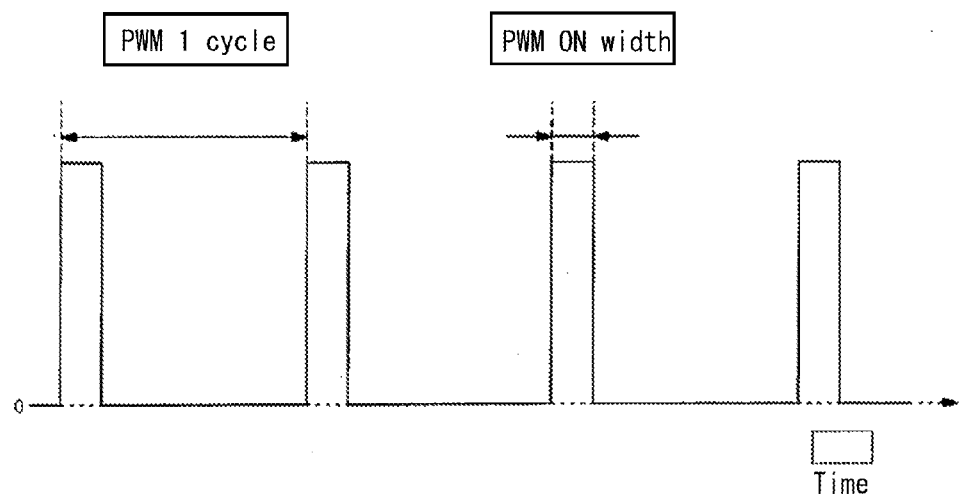
FIG. 6 It is a timing diagram showing an example of waveform of current which is supplied to a heater from a drive circuit.

FIG. 6 is a schematic timing diagram showing a waveform of current which is supplied to the heater 7 from the drive circuit U3 in the lighting circuit of the laser light source apparatus according to an embodiment of the present invention. In order to carry out feedback control of the amount of electric power supplied to the heater 7, the temperature control unit 21b of the control means F1 determines a PWM1 cycle and a PWM ON width which are shown in the figure, thereby generating a PWM signal. In addition, instead of the PWM signal, a signal having analog quantity, which is similar to the PWM signal, such as a frequency modulated signal, may be generated. The amount of electric power supplied to the heater 7 is adjusted by an increase and a decrease in this ON width, so that the temperature of the wavelength conversion element 5 is controlled. A control system, which is generally known as "ON/OFF-PID control" can be used" as the feedback control method. The PID control is a method for performing control so that a proportionality element, an integration element, and a differentiation element are combined so as to become a target temperature. In addition, a value of approximately several kilohertz is adopted as the frequency of the PWM output used in the present embodiment.

Figure 7:
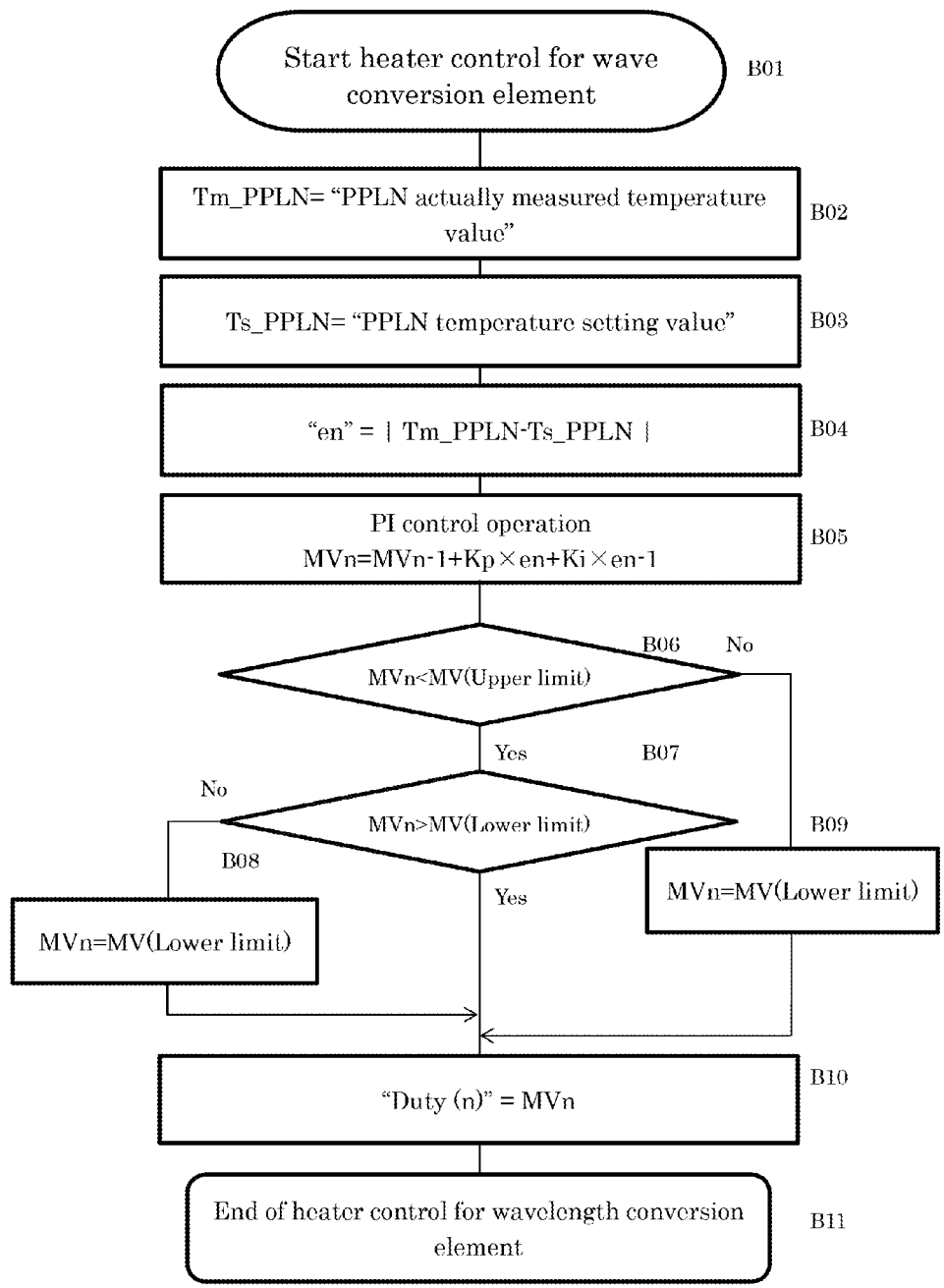
FIG. 7 It is a flow chart showing an example of control and processing in a temperature control unit of a control unit.

FIG. 7 is a flow chart showing an example of control and processing in the temperature control unit 21b of the control means F1. The flow chart shown in FIG. 7 can be realized by software process in a microcomputer mounted in the above-described control means F1. The temperature control unit 21b of the control means F1 performs, for example, processing described below and shown in the flow chart, and the temperature of the wavelength conversion element 5 is controlled so as to turn into the optimal target temperature set up by the optimal temperature setting unit 21a. In order that the temperature control unit 21b of the control means F1 controls the temperature of the wavelength conversion element 5 so as to turn into target temperature, the temperature (temperature of the heat exchanger plate 6 heated by the heater 7 in FIG. 1) of the wavelength conversion element 5 is detected by the temperature detection unit Th1, and an output manipulating value to the heater 7 is periodically put in execution and is controlled by comparing the detected temperature with the optimal setting temperature which will serve as target temperature. With respect thereto, a typical technique, PI control, in which proportionality element and integration element are combined with each other, will be explained below as an example.

In FIG. 7, heater control starts at a step (B01). First, in Step (B02), the present temperature of the heat exchanger plate 6 heated by the heater 7, which is correlated with the temperature of the wavelength conversion element 5, that is, an actually measured value of the temperature (PPLN actually measured temperature value) of the wavelength conversion element 5, is measured by the temperature detection unit Th1, and the actually measured temperature (Tm_PPLN) is obtained. Next, in Step (B03), the target temperature of the wavelength conversion element 5, i.e. an optimal temperature setting value (PPLN temperature setting value) of the wavelength conversion element 5 set up by the optimal temperature setting unit 21a of the control means F1 is read out, so that an optimal temperature setting value (Ts_PPLN) is obtained. And in Step (B04), the optimal temperature setting value (Ts_PPLN) and the actually measured temperature value (Tm_PPLN) measured by the temperature detection unit Th1 are compared with each other, thereby the difference (en) therebetween is obtained. In Step (B05), a PI operation is performed using this difference (en). In this PI operation, the amount of electric power supplied to the heater 7, i.e., the manipulating value to the heater 7, is calculated from expression (1).

$$MVn = MVn-1 + Kp \times en \times Ki \times en-1 \qquad (1)$$

Here, MVn, MVn−1, en, and en−1 respectively represent a manipulating value of this time, a manipulating value of the last cycle, a temperature difference value which is calculated this time, and a temperature difference value which is calculated in last cycle, and kp and ki are constants.

Although the manipulating value (MVn) computed by the PI operation will be updated as an ON width of a PWM signal sent out from the control means F1, when the manipulating value (MVn) exceeds the maximum (MVn upper limit) in Step (B06), the manipulating value is treated as the manipulating value (MVn), and when it is less than the minimum (MVn lower limit) in Step (B07), the manipulating value is treated as the manipulating value (MVn), whereby upper and lower limit restrictions are performed (Step (B08), and Step (B09)). And at the Steps (B06-B9), the manipulating value, which is finally determined, is updated as an ON width (Duty (n)) of the PWM signal to be sent out from the control means F1, and heater control of the cycle ends (Step (B10)). A series of the operations from Step (B01) to Step (B11) are repeated in a predetermined cycle. The control is stably performed so that the wavelength conversion element 5 becomes the optimal temperature, by performing this flow chart periodically and by performing feedback control. Although the PI control method which is made up of proportional control and an integration element is used in the above-explained control algorithm, other feedback control methods including, for example, control such as in the PID control to which a differentiation (differentiation) element is added, may be used.

Figure 8:
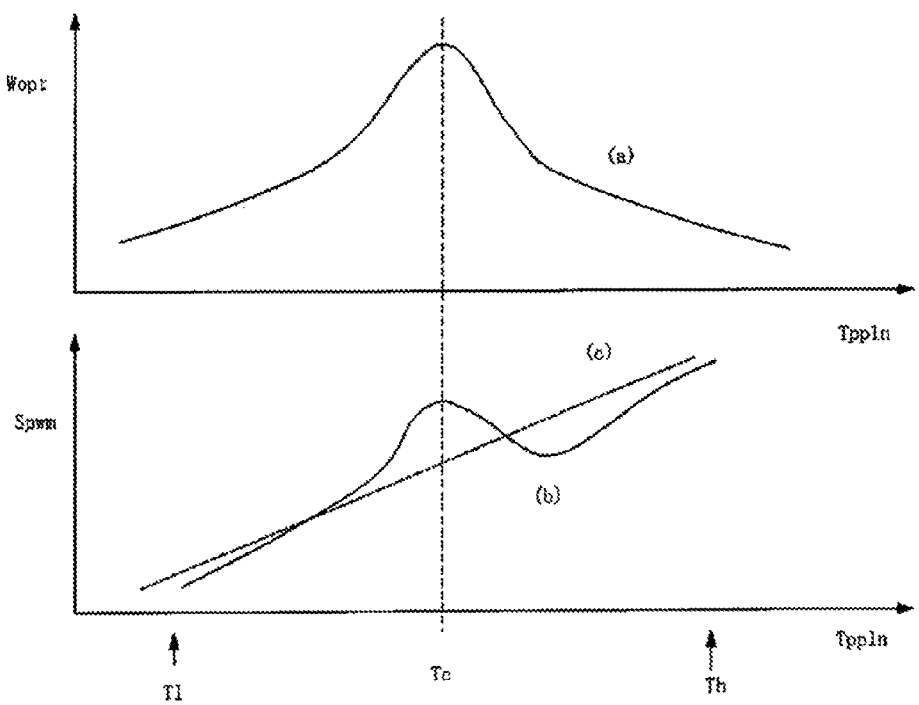
FIG. 8 It is a diagram showing light output from a laser light source unit to a setting temperature of a wavelength conversion element, and the amount of electric power supplied to a heater.

Next, in the present invention, description of a method of obtaining the optimal target temperature at which the wavelength conversion efficiency of a wavelength conversion element becomes the highest, will be given. FIG. 8 is a diagram showing light output from the laser light source unit with respect to a setting temperature of the wavelength conversion element, and the amount of electric power supplied to the heater. FIG. 8 (a) is a diagram showing a light output Wopt with respect to the heater control temperature Tppln (namely, the temperature of the wavelength conversion element), and FIG. 8 (b) is a diagram showing an ON width of an PWM output outputted from the control means F1 with respect to the temperature (Tppln) of the wavelength conversion element, in case where feedback control of the temperature of a wavelength conversion element is carried out. The direction of the horizontal axis in FIG. 8 shows temperature, wherein in FIG. 8 (a), the vertical axis direction shows light output (Wopt) from the laser light source, and in FIG. 8 (b), it shows the PWM ON width of the PWM signal (Spwm) representing the amount of electric power supplied to the heater 7, which is described above. In addition, the PWM signal (Spwm) may be considered as a Duty ratio.

Figure 9:
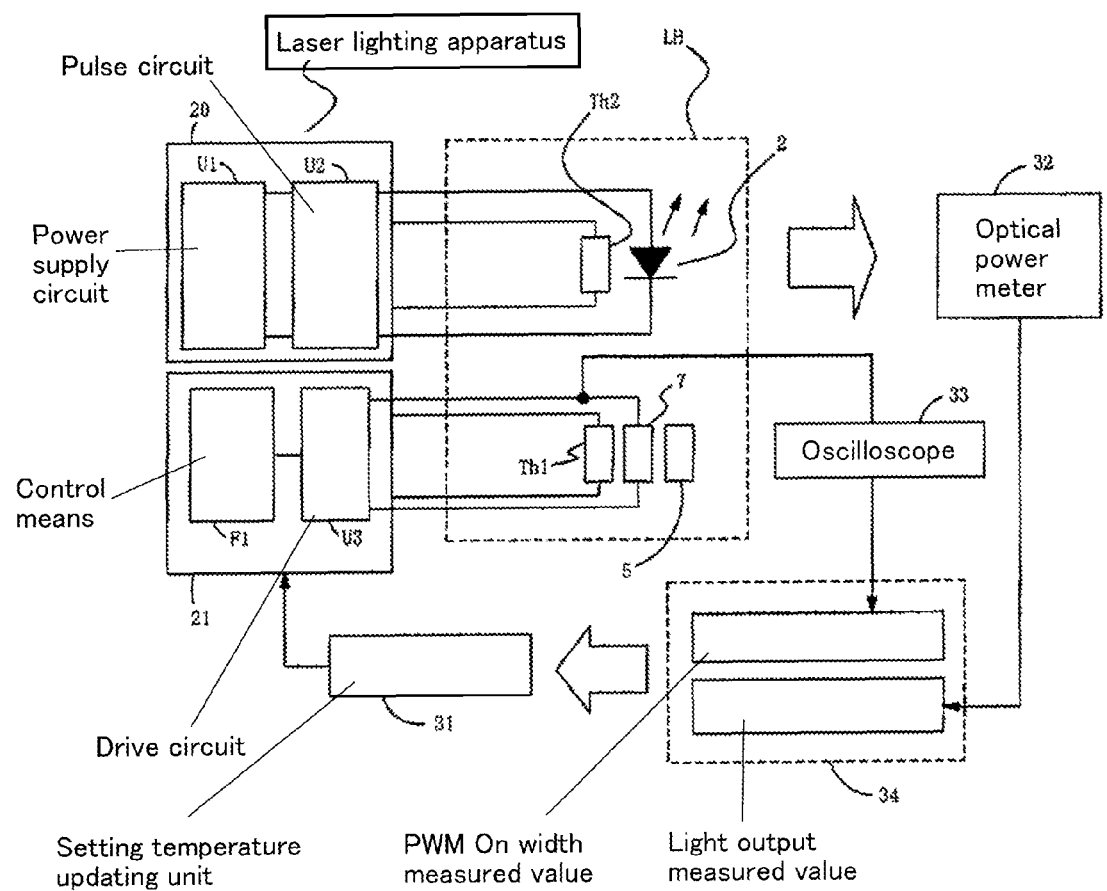
FIG. 9 It is a diagram showing a configuration example of an experimental apparatus used in order to obtain characteristics, such as FIG. 8.

The property data of FIG. 8 is measured by using an experimental device shown in FIG. 9.

In FIG. 9, LH indicates the above-described laser light source, 20 indicates a lightning circuit and 21 indicates control unit, wherein electric power is supplied to the semiconductor laser 2 from the lightning circuit 20, whereby the semiconductor laser 2 is turned on, as described above. Moreover, the control unit 21 performs feedback control of the temperature of the wavelength conversion element 5 by controlling the heating amount by the heater 7 which is a heating unit so that the temperature of the wavelength conversion element 5 (here PPLN), which is detected by temperature detection unit Th1, may turn into the setting temperature of the wavelength conversion element 5, which is given by a setting temperature updating unit 31. Moreover, 32 denotes an optical power meter for measuring light output of the laser light source unit, and 33 denotes an oscilloscope for acquiring waveform of the PWM output outputted to the heater 7, wherein the light output measured by the optical power meter 32 and the ON width of the PWM output measured by the oscilloscope 33 are stored on, for example, a memory unit 34 etc.

In FIG. 9, first, the setting temperature of the wavelength conversion element 5 is set to 80.0 degrees Celsius and output voltage to the semiconductor laser 2 is set to 2.70 V, so that DC output is supplied to the laser (LD). Although the DC output is used in this experiment, it may be changed into a pulse having predetermined ON width and frequency, by the pulse circuit U2 in a laser lighting apparatus, thereby supplying it to the semiconductor laser 2. The semiconductor laser 2 is lighted under the above-described conditions so as to irradiate the wavelength conversion element 5 with laser light, and an output value of the light output outputted from the laser light source unit LH is measured by using the optical power meter 32. Furthermore, the output voltage to the heater 7, which is outputted from the drive circuit U3, is observed by the oscilloscope 33, and the ON width of the PWM output at that time is measured. In addition, at this time, the control unit 21 carries out feedback control so that the temperature of the wavelength conversion element 5 detected by the temperature detection unit Th1 may become the above-mentioned setting temperature (for example, 80.0 degrees Celsius). After the end of the measurement of the light output and the ON width of the PWM output, the setting temperature of the wavelength conversion element 5 is raised by 0.1 degree Celsius by the setting temperature updating unit 31. That is, it is updated to 80.1 degrees Celsius and while the output voltage is maintained at 2.70 V, the semiconductor laser (LD) is lighted again. At this time, the light output is measured by the optical power meter 32 and the ON width of the PWM output outputted from the drive circuit U3 is measured by the oscilloscope 33.

Hereafter, similarly while the setting temperature of the wavelength conversion element 5 is raised by 0.1 degree Celsius at a time, the light output and the ON width of the PWM signal outputted from the drive circuit U3 are measured at that time. Such a series of operations continues until it turned into the setting temperature maximum of a predetermined wavelength conversion element, for example, 120.0 degrees Celsius. It is possible to collect the ON width of the PWM signal and the measured data of optical power by repeating this in a range of 80 degrees Celsius to 120 degrees Celsius. And it is possible to obtain a characteristic diagram shown in FIG. 8 by plotting the setting temperature of the wavelength conversion element, the obtained light output from the laser light source element LH, and further the relationship of the ON width of the PWM output outputted from the drive circuit U3.

The characteristic diagram of the light output (Wopt) from the laser light source unit LH with respect to the setting temperature (Tppln) of the wavelength conversion element shown in FIG. 8 will be explained below. As mentioned above, because of the character of this laser light source unit LH, the light of the wavelength outputted from the semiconductor laser 2 can be changed into visible light with the greatest conversion efficiency by setting the wavelength conversion element 5 at specific temperature (Tc). FIG. 8(a) shows the situation. Next, FIG. 8 (b) showing the characteristic of the PWM signal (Spwm) with respect to the setting temperature (Tppln) of the wavelength conversion element will be explained. In general, when the temperature of the heater is raised so that the temperature of the wavelength conversion element 5 is raised, it is only necessary to simply increase the amount of electric power supplied to the heater, and a tendency thereof is of the characteristic (c), which is shown in FIG. 8 and which has a diagonal stroke rising toward top right. However, in FIG. 8, as for the amount of electric power supplied to the heater 7, as shown in FIG. 8 (b), the temperature (Tc) of the heater at which the light output (Wopt) of the laser light source turned into the maximum, and the temperature (Tc) of the heater at which the PWM signal (Spwm) turned into the maximum are in agreement with each other. This phenomenon has been acquired as new knowledge by inventors this time, and this experimental result shows the tendency different from the theory shown in the above described (c).

This phenomenon can be explained as set forth below. Although most part of infrared rays outputted from the semiconductor laser 2 is changed into visible light at around the temperature (Tc), they are mostly trapped as infrared rays in a temperature range where a rate at which the infrared rays are changed into visible light, is low, and are used for heating the wavelength conversion element 5 and the heater 7, so that heating by radiation heat is performed. Because, as mentioned above, the PWM signal (Spwm) is controlled in a feedback manner in order to control it to the preset target temperature in the lightning circuit of the laser light source apparatus according to the present invention, the PWM signal output is also controlled so as to increase or decrease depending on increase or decrease in the disturbance of these infrared rays. Therefore, in a range in which the heater 7 receives much radiant heat, even the amount of electric power supplied to the heater 7 is small, it turns into the setting temperature sufficiently. On the other hand, since the above-described radiant heat is decreasing at a point (near the temperature Tc) where high conversion efficiency to visible light is high, the lightning circuit performs control so as to increase the amount of electric power supplied to the heater 7. For this reason, point(s) where the amount of electric power supply is the highest is considered to cover a temperature range where the conversion efficiency of the wavelength conversion element is the highest.

Figure 17:
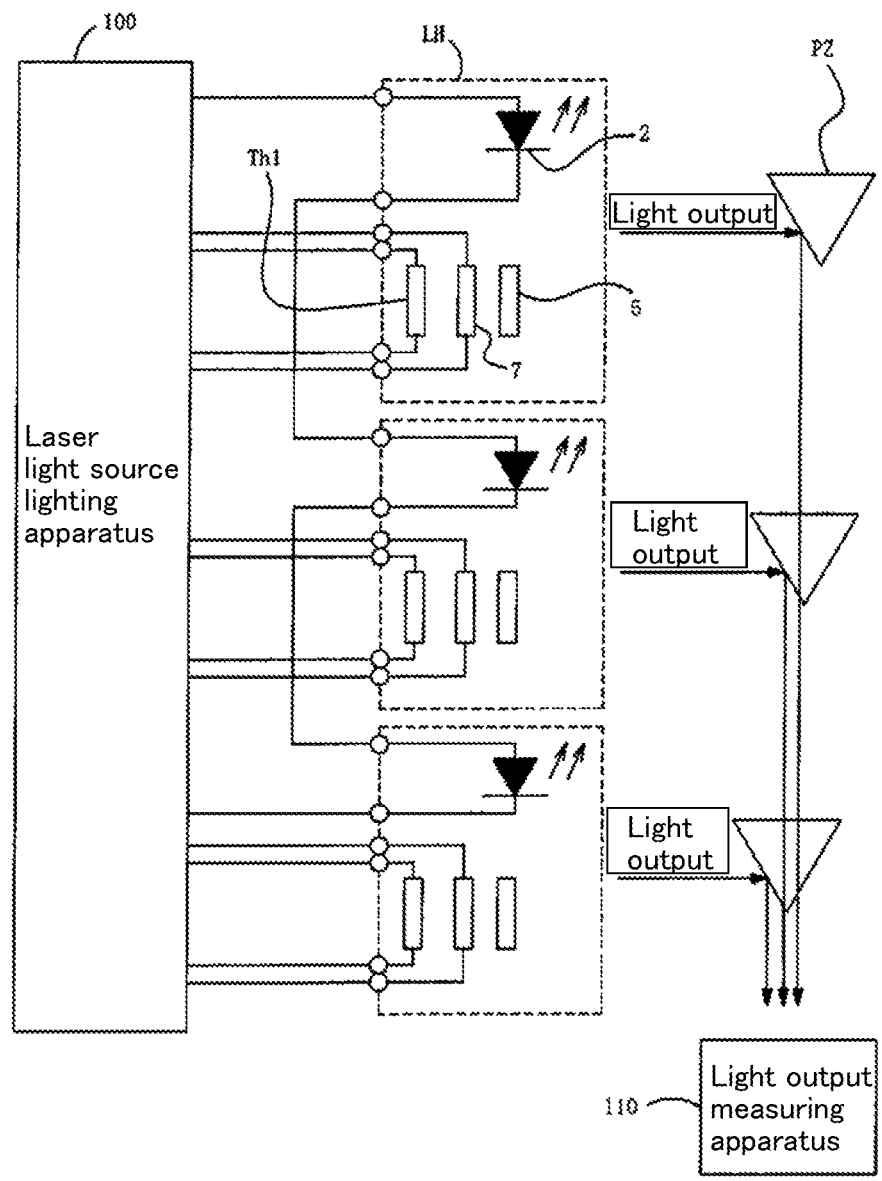
FIG. 17 It is a block diagram of another configuration example of a conventional laser light source apparatus to which a laser is in series connected.

In order to detect the optimal setting temperature (Tppln) of this wavelength conversion element, while updating setting of the setting temperature (Tppln) little by little in a temperature range from lower limit temperature (Tl) to upper limit temperature (Th) in which inclusion of the optimal temperature (Tc) can be expected, the optimal temperature (Tc) can be detected by observing and memorizing the occasional PWM signal (Spwm). According to the present invention, it is possible to obtain the optimal temperature (Tc), without using means for measuring light independently, that is, without generating unnecessary cost, whereby the advantage of the present invention can be enjoyed. Furthermore, in case of, for example, a large-sized projection system, which is a product configured by using two or more, or a lot of laser light source units LH, very long adjustment time is required when it is measured one at a time. However, according to the present invention, even in case of two or more laser light source units, it is possible to search the optimal temperature simultaneously, so that sharp reduction of working hours is attained, and the advantage of the present invention can be enjoyed. Furthermore, according to the present invention, since it is not necessary to measure the emitting light output even in case of the circuit configuration (for example, the configuration of FIG. 17) in which the laser diode of the semiconductor laser 2 is in series connected thereto, it becomes possible to find the optimal temperature simply, and the advantage of the present invention can be enjoyed.

Figure 10:
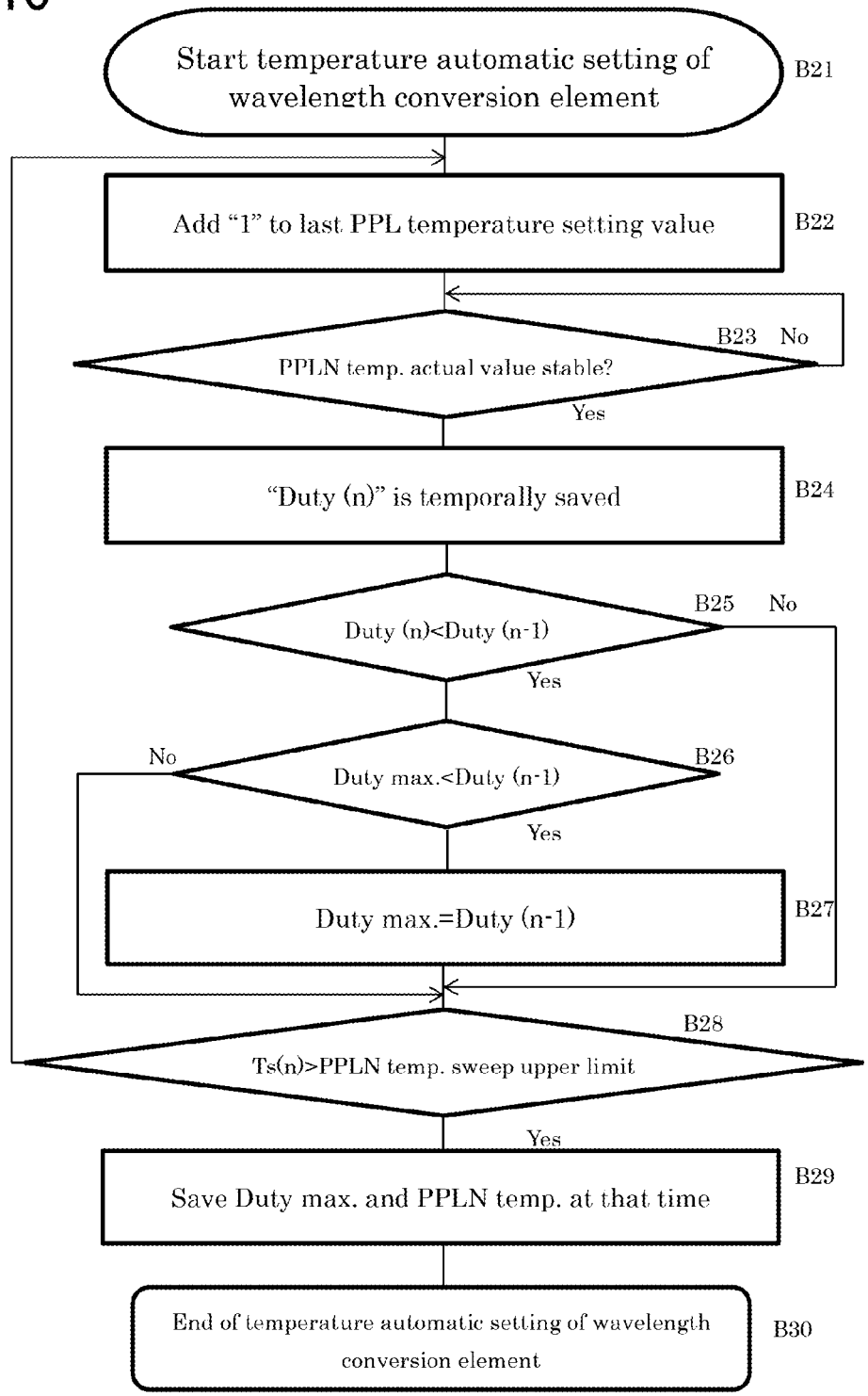
FIG. 10 It is a flow chart showing an example of control and processing in an optimal temperature setting unit of a control unit.

FIG. 10 is a flow chart showing an example of control and processing in the optimal temperature setting unit 21*a* of the control means F1. The flow chart shown in FIG. 10 can be realized by the software processing in a microcomputer mounted in the above-described control means F1, and the optimal temperature setting unit 21*a* of the control means F1 sets the optimal setting temperature of the wavelength conversion element 5 by performing processing shown, for example, in the flow chart set forth below. The flow chart shown in FIG. 10 shows procedure in which, in order to decide the maximum value of the amount of electric power supplied to the heater 7, size relations are obtained by comparing a duty ratio (duty ratio) for the amount of electric power supplied to the heater at a certain temperature of the wavelength conversion element, with a duty ratio (duty ratio) at the last setting temperature whereby the point, at which the amount of electric power supply becomes the maximum, is obtained thereby obtaining the optimal temperature of the wavelength conversion element.

Referring to FIG. 10, the processing for detecting the optimal temperature of the wavelength conversion element will be explained. In Step B21, first, a signal for starting a temperature automatic setting operation as to the wavelength conversion element 5 is inputted. Next, "1" is added to a measured temperature value (PPLN temperature setting value) of the wavelength conversion element 5, which has been measured last time in Step B22. That is, it is set as the temperature (Ts (n)) at one step following therefrom (for example, a preset value is set to 90.1 degrees Celsius, if the last temperature measured value is 90 degrees Celsius and the width of each step of a temperature rise is 0.1 degree Celsius). In Step B23, the temperature of the wavelength conversion element 5 is actually measured and it is judged whether it is stabilized. If the temperature (PPLN actually measured temperature value) of the wavelength conversion element 5 is stable, the duty ratio (Duty (n)) of the heater 7 whose ON/OFF control is carrying out, is temporarily saved as the amount of power supply applied to the heater 7 in a state where it is stabilized at the setting temperature in Step B24. In Step B25, this duty ratio (Duty (n)) at this time's setting temperature is compared in size with a duty ratio (Duty (n−1)) at time when it is stabilized at the setting temperature at one step before therefrom. When this time's duty ratio (Duty (n)) is larger than that of the last time, it jumps to Step B28. On the contrary, when this time's duty ratio is smaller than that of the last time, it is judged whether the last time's duty ratio (Duty (n−1)) is larger than the maximum (Duty maximum value) of the duty ratio (Step B26). When it is not the maximum value, it jumps to Step B28. When it is larger than the maximum value, the last time's duty ratio (Duty (n−1)) is newly registered as the maximum value (Duty maximum value) (Step B27).

Next, in Step B28, the size of the upper limit (PPLN temperature upper limit value) in a setting temperature sweeping range of the wavelength conversion element 5 (for example, 80 degrees Celsius to 100 degrees Celsius), and that of the temperature Ts (n) in one step further with respect to the measured temperature value of the wavelength conversion element 5, which is set this time, are compared with each other. When it is less than the upper limit of the temperature which the temperature Ts (n) sweeps, it returns to Step B22 and the same steps are repeated. When it reaches the upper limit of the temperature which Ts (n) sweeps, the maximum value (maximum value of Duty) of the duty at that time is recorded, and the temperature (PPLN temperature) of the wavelength conversion element 5 in the case of the maximum value is set as the optimal temperature of wavelength conversion (Step B29). If the optimal temperature of the wavelength conversion element 5 is determined, an automatic setup of the temperature of the wavelength conversion element 5 is ended in Step B30. Thus, by operating it according to the flow chart, the curve (b) shown in FIG. 8 can be the maximum value, that is, the optimal temperature of the wavelength conversion element 5 can be detected and set up, without monitoring the light output at the time of the temperature Tc.

Figure 11:
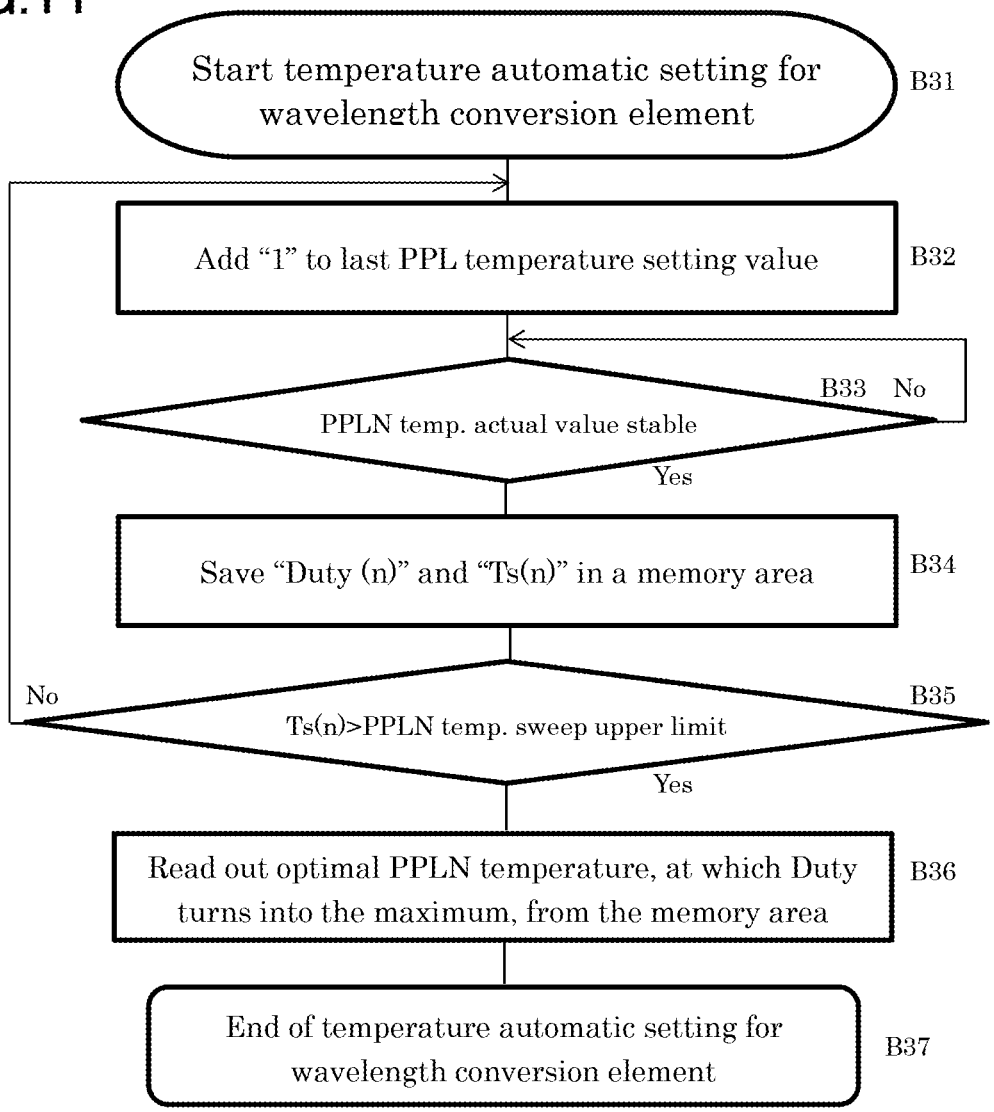
FIG. 11 It is a flow chart showing another embodiment of control and processing in an optimal temperature setting unit of a control unit.

FIG. 11 is a flow chart which showing another embodiment of control and processing in the optimal temperature setting unit 21*a* of the control means F1. FIG. 11 shows a procedure in which while the temperature of the wavelength conversion element 5 is changed in a certain range (for example, changed in the range of the temperature T1-Th shown in FIG. 8), the temperature in each step and the amount of electric power supplied to the heater at that time (Duty ratio in the present embodiment), are saved in a memory, whereby the temperature at which the amount of electric power supply is the maximum, among data of all the temperature (for example, temperature T1-Th) is set as the optimal temperature of the wavelength conversion element.

In FIG. 11, the steps (Steps B31 to B33) performed until temperature of the wavelength conversion element 5 is actually measured and it judges whether it is stabilized, are the same as those of the case (steps B21 to B23) shown in FIG. 8. When the temperature is stabilized, the duty ratio (ON width of a PWM output: Duty (n)) of electric power which is supplied to the heater at Step B34, and the setting temperature (Ts (n)) of the wavelength conversion element 5, are temporarily stored in a memory region of a microcomputer etc. Next, until the setting temperature (Ts (n)) reaches the upper limit (PPLN temperature sweeping upper limit) of the setting temperature sweeping range (for example, 80 degrees Celsius to 100 degrees Celsius) of the wavelength conversion element 5, which has been set up in advance, the setting temperature is added one step by one step, and the above-mentioned operation is repeated (Step B35→Steps B32-B34), and the data is stored in the above-mentioned memory region. After all the data is saved in the memory region, the maximum value of the ON width of the PWM output is read from among all the data in the memory region saved at Step B36, and the temperature of the wavelength conversion element 5 at that time is set as a temperature (PPLN temperature) of the optimal wavelength conversion element 5 (Step B37).

The control and processing by the temperature control unit 21*b* shown in FIG. 7, and detection of the optimal setting temperature of the wavelength conversion element by the optimal temperature setting unit 21*a* shown in FIG. 10 or 11, are performed at timings as set forth below. For example, before shipping a laser light source apparatus, the optimal preset value of temperature of the wavelength conversion element 5 is obtained and saved in the procedure shown in the flow chart of FIG. 10 or 11. And where there is no change in an environmental state at the time of an operation of the apparatus, the control and processing shown in the flow chart of FIG. 7 is performed, so that the temperature of the wavelength conversion element 5 is controlled, by this preset value. Moreover, as set forth below, when the ambient temperature of the semiconductor laser 2 etc. changes, that is, for example, the environmental state thereof changes, the optimal temperature of the wavelength conversion element changes, so that the processing of FIGS. 10 and 11 is performed according to the change of the environment state, whereby the optimal preset value is updated. In addition, the processing for obtaining the above-mentioned optimal setting temperature, is carried out at the time of the start of an operation at the beginning of the day, at time the seasons change, once a month or once a week, and a periodical calibration and scheduled maintenance may be performed. Moreover, it may be performed when the semiconductor lasers are replaced.

By the way, as mentioned above, the light output in the laser light source apparatus is greatly dependent on the temperature of the wavelength conversion element 5 because of the character. In order to obtain high conversion efficiency from this wavelength conversion element, control of temperature with very high accuracy is required. However, the optimal temperature, at which this high conversion efficiency is acquired, may gradually change during a lighting operation of the laser light source apparatus, depending on temperature of surrounding of the semiconductor laser 2, temperature of an external resonator when it has the external resonator, or usage environment such as other lighting states. For example, the optimal temperature changes in connection with case where the installation location of the laser light source apparatus is moved, or change of seasonal ambient temperature, etc., so that each time it is necessary to obtain the optimal heater setting temperature in order to set the optimal temperature of the wavelength conversion element.

Figure 12:
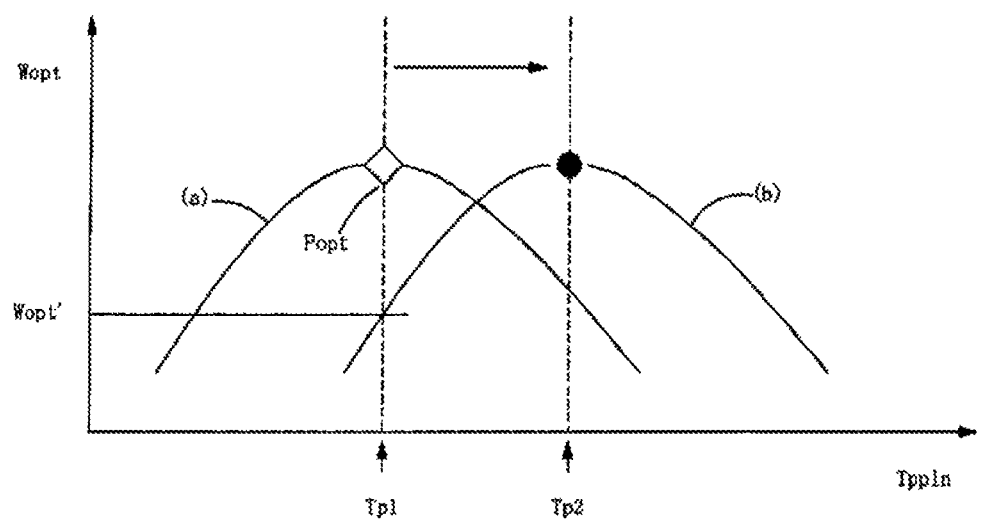
FIG. 12 It is a diagram showing relation of light output from a laser light source unit to temperature of a wavelength conversion element.

FIG. 12 is a diagram showing relation of light output (Wopt) from a laser light source unit LH to the temperature of the wavelength conversion element 5. In FIG. 12, the vertical axis indicates light output (Wopt) from the laser light source unit LH, and the horizontal axis indicates temperature (Tppln) of the wavelength conversion element 5 (FIG. 12 shows case where a PPLN is used). First, the temperature characteristics of the wavelength conversion element in a given set of circumstances, where, for example, the ambient temperature is 5 degrees Celsius at time of starting in winter, includes the characteristic where light output turns into the maximum (Popt) at Tp1 as shown in FIG. 12(*a*). At this time, the optimal temperature of the wavelength conversion element 5 is Tp1 and control is performed so that this temperature may be maintained. However, in case of change in circumference environment, for example, where ambient temperature turns into 25 degrees Celsius, the light conversion characteristic of the wavelength conversion element shifts as shown in (b). In this case, when the heater temperature Tp1, which is adjusted at the beginning, is maintained, the light output, to which wavelength conversion is carried out, will decrease from Popt to even Wopt'. Here, if the heater temperature is raised even to Tp2, the optimal wavelength conversion characteristic under the environment shown in (b) can be acquired.

Figure 13:
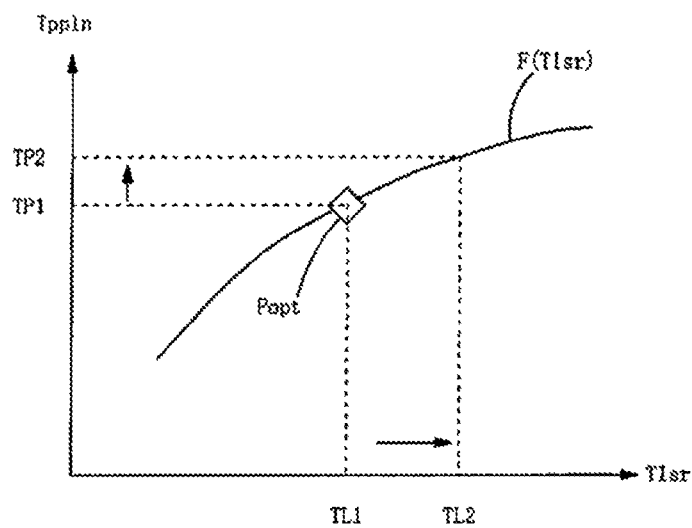
FIG. 13 It is a characteristic diagram showing correlation of the device temperature and setting temperature of an optimal wavelength conversion element.

As shown in FIG. 12, although the optimal heater temperature can be detected in order to acquire the optimal wavelength conversion characteristic under fixed condition in a certain environment, when this optimal temperature shifts due to the environmental change etc., means for automatically following such a phenomenon is needed. FIG. 13 is a characteristic diagram showing correlation of the device temperature which is ambient temperature of the semiconductor laser 2, to the optimal setting temperature (Tppln) of the wavelength conversion element 5.

A characteristic diagram shown in FIG. 13 can be made by measurement by using an experimental device shown in FIG. 9. That is, as described above, in FIG. 9, electric power is supplied to the semiconductor laser 2 from the lightning circuit 20, thereby lighting the semiconductor laser 2. Moreover, the amount of heating from the heater 7, which is the heating unit, is controlled by the control unit 21, so as to carry out feedback control of the temperature of the wavelength conversion element 5 in which the temperature of the wavelength conversion element 5 (here PPLN) may turn into the setting temperature of the wavelength conversion element 5 given from the setting temperature updating unit 31. And at first, the optimal value of the temperature of the wavelength conversion element 5 at which the light output turns into the maximum when the temperature of the semiconductor laser 2 measured by the temperature detection unit Th2 is 35.0 degrees Celsius, is obtained. As to a way of obtaining the optimal value of the temperature of the wavelength conversion element 5, the setting temperature of the wavelength conversion element is updated as described above, and the PPLN setting temperature at which the light output becomes the maximum, can be obtained by measuring the light output each time.

Next, the temperature of the semiconductor laser 2 is raised by 1.0 degree Celsius, that is, 36.0 degrees Celsius, and the optimal value of the temperature of the wavelength conversion element 5 is again measured. In addition, here, for example, temperature control by water-cooling which uses a chiller or a temperature control unit which uses a cooling FAN may be used for the temperature adjustment unit for the temperature of the semiconductor laser 2. Thus, the temperature of the semiconductor laser 2 measured by the temperature detection unit Th2 is sequentially updated, and the optimal value of the temperature of the wavelength conversion element 5 is calculated each time. By repeating this, for example, the measured data of lighting apparatus temperature of the semiconductor laser 2 can be collected between 20.0 degrees Celsius-40.0 degrees Celsius. Finally, the characteristic of FIG. 13 can be obtained by setting a horizontal axis as the temperature of the semiconductor laser 2 measured by the temperature detection unit Th2, and a vertical axis as setting temperature which turns into the optimal value of the PPLN temperature at which light output is becomes the maximum.

As mentioned above, although the light conversion characteristics of a wavelength conversion element shift due to change of a circumference environment, the present invention deals with such a problem as set forth below. An example shown in FIG. 13 will be described below. In a certain environment, for example, when the ambient temperature is 5 degrees Celsius, supposing that the temperature at time of stable lighting of the semiconductor laser 2 is TL1, a point at which the conversion efficiency of the wavelength conversion element 5 becomes the maximum, is time at which the temperature of this wavelength conversion element 5 turns into TP1. Next, when the ambient temperature hits 25 degrees Celsius, that is, when temperature at time of stable lighting of this semiconductor laser 2 reaches TL2, the point at which the conversion efficiency of the wavelength conversion element becomes the maximum is time when the temperature of this wavelength conversion element 5 is TP2. By obtaining an expression of relations from the data, and controlling the setting temperature of the wavelength conversion element 5 by a function F (Tslr) in which the temperature of the ambient environment of semiconductor laser is a variable, it is possible to offer a laser light source apparatus in which a state where the wavelength conversion efficiency is high can be maintained even if a circumference environment changes at time of an operation thereof. Moreover, other than making a calculation as the function of relation of FIG. 13 each time, each of data may be saved in a memory, and the heater setting temperature corresponding to a data table may be controlled.

Figure 14:
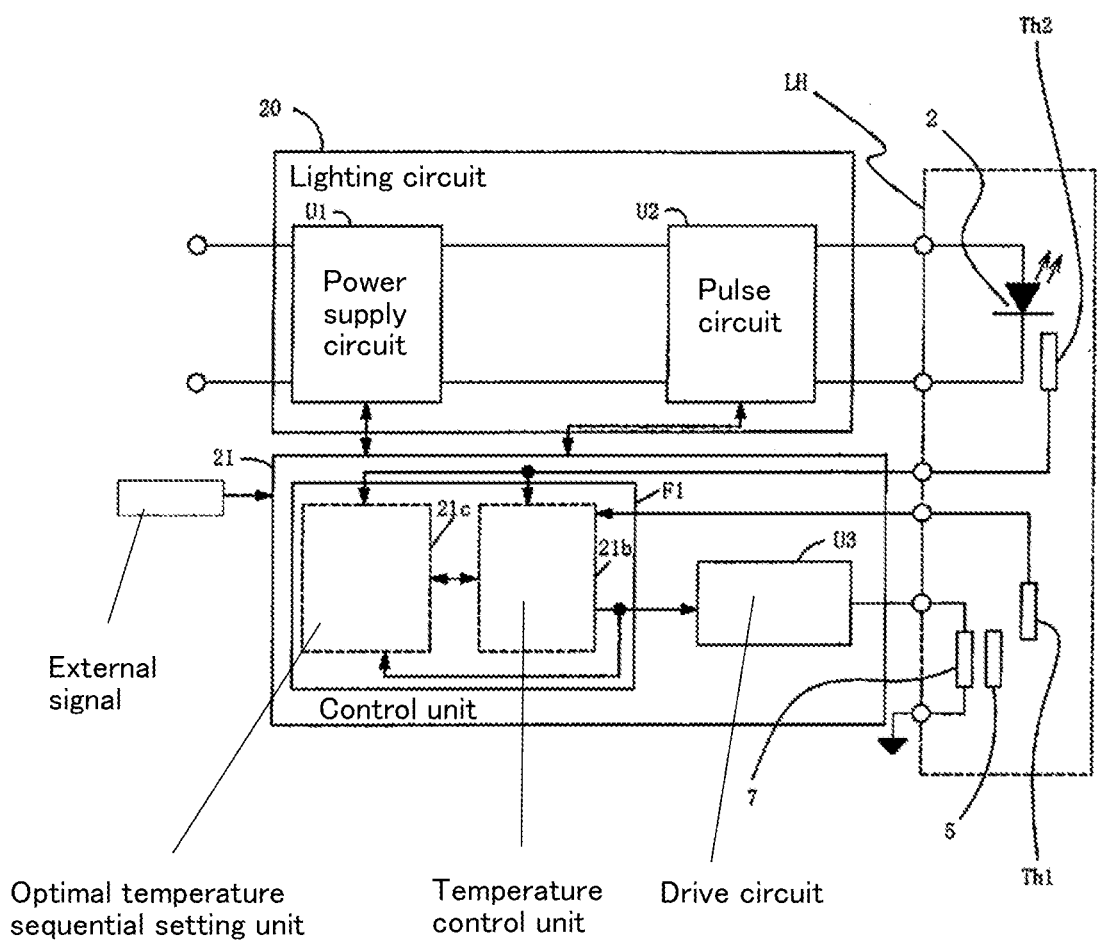
FIG. 14 It is a block diagram showing the structure of a control unit and a lightning circuit in a laser light source apparatus according to a second embodiment of the present invention.

FIG. 14 is a block diagram showing the structure of a control unit and a lightning circuit in a laser light source apparatus according to a second embodiment of the present invention, wherein, as mentioned above, setting temperature of a wavelength conversion element is controlled according to change of the ambient environment. This is different in structure from what is shown in FIG. 2, in that while an apparatus temperature detection unit Th2 which detects temperature near the semiconductor laser 2 is provided, an optimal temperature sequential setting unit 21c is provided in a control means F1, instead of providing the above-mentioned optimal temperature setting unit 21a, and further the procedure of detecting optimal setting temperature is different from what is explained in the first embodiment. Other structural elements and operations are the same as what is explained in the first embodiment.

That is, a lightning circuit 20 is made up of an electric power supply circuit U1 and a pulse circuit U2 which supplies pulse-like electric power, as described above, wherein suitable voltage and current are outputted to the semiconductor laser 2 according to a state or lighting sequence of the semiconductor laser 2. Moreover, provided are a wavelength conversion element 5 (for example, PPLN) for changing wavelength in order to change, into visible light, infrared rays which the semiconductor laser 2 emits, a heater 7 for raising it, and a temperature detection unit Th1. The control unit 21 comprises the control means F1, a drive circuits U3 which drives the heater 7, and the electric power supply circuit U1 and the pulse circuit U2 are controlled by the control means F1. The control means F1 has the optimal temperature sequential setting unit 21c and a temperature control unit 21b. As shown in the flow chart of FIG. 7, the temperature control unit 21b controls the amount of electric power supplied to the heater 7 based on a difference between the temperature detected by the temperature detection unit Th1 and the setting temperature set up by the optimal temperature setting unit 21c, thereby performing feedback control so that the temperature of the wavelength conversion element turns into the setting temperature.

When the apparatus temperature which is the ambient temperature of the semiconductor laser is detected, the optimal temperature sequential setting unit 21c periodically obtains the setting temperature (or that compensation value) of the wavelength conversion element corresponding to this temperature, by using a function or a table, thereby setting the optimal setting temperature, and sends this optimal setting temperature to the above-mentioned temperature control unit 21b. The temperature control unit 21b controls the temperature of the wavelength conversion element 5 so that the temperature of the wavelength conversion element 5 turns into the above-mentioned setting temperature. That is, when the wavelength conversion element 5 is irradiated with laser light at a certain apparatus temperature (surrounding temperature of the semiconductor laser, etc.), the optimal temperature sequential setting unit 21c changes the setting temperature of the wavelength conversion element 5, measures the amount of electric power supplied to the heater 7 at each setting temperature, obtains temperature in case where the amount of electric power supply becomes the maximum, and sets this temperature as a first optimal setting temperature at the above-mentioned apparatus temperature. And an amount of compensation of the setting temperature is computed by using, as a parameter, the apparatus temperature such as a surrounding temperature etc. of the semiconductor laser 2 measured by the temperature detection unit Th2, with respect to this optimal setting temperature, and the setting temperature is periodically updated one by one to this optimal setting temperature. In addition, the above-mentioned setting temperature compensation amount etc. may be calculated by using a function, a table, etc. by using, as parameter, the condition of the electric power applied to the semiconductor laser 2, instead of using the apparatus temperature as a parameter. Or the above-mentioned setting temperature compensation amount etc. may be calculated by setting the above-mentioned two parameters, that is, the apparatus temperature and the electric power condition by using a function, a table, etc.

Figure 15:
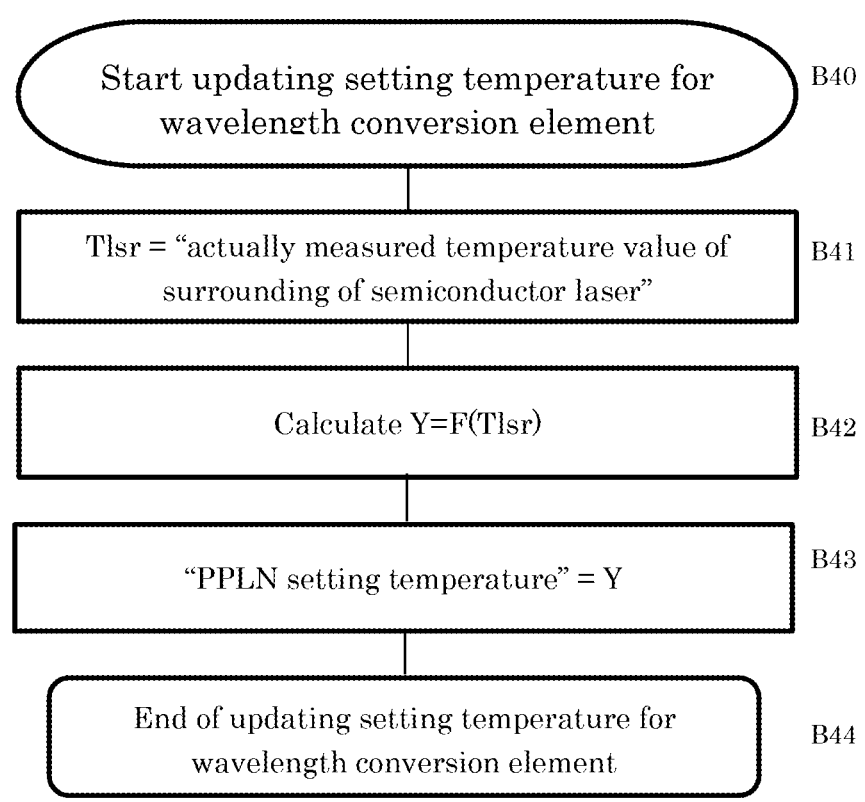
FIG. 15 It is a flow chart showing an example of control and processing in an optimal temperature sequential setting unit of a control unit according to a second embodiment of the present invention.
Figure 16:
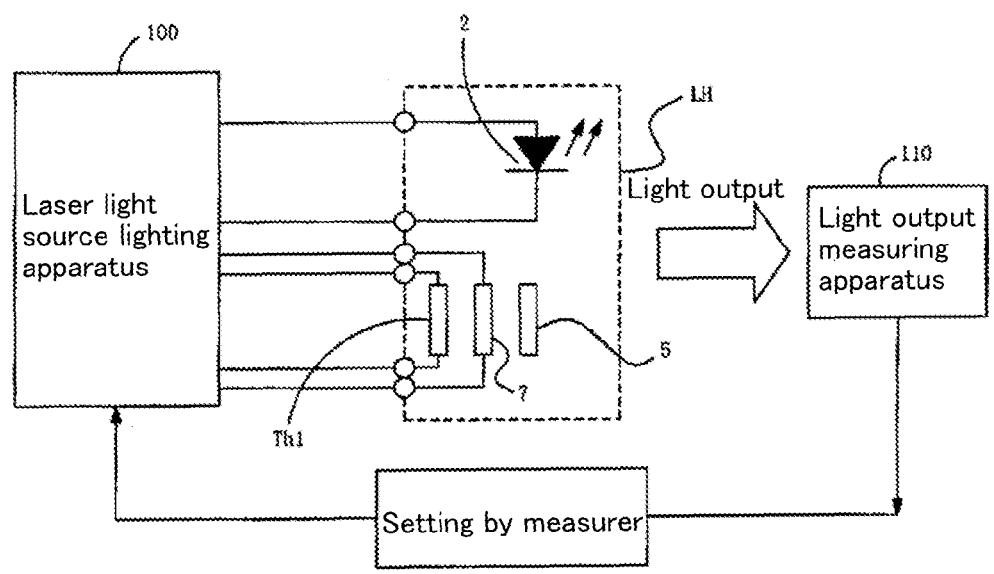
FIG. 16 It is a block diagram showing a method of detecting optimal temperature of a wavelength conversion element in a conventional laser light source apparatus.

FIG. 15 is a flow chart showing an example of control and processing in an optimal temperature sequential setting unit of the control means F1 according to the second embodiment of the present invention. FIG. 15 shows a procedure wherein the temperature of the wavelength conversion element, at which light output from the laser light source unit LH becomes the maximum, is updated according to change of the apparatus temperature. In FIG. 15, first, surrounding temperature (Tlsr) of the semiconductor laser obtained by the apparatus temperature detection unit Th2 is measured (Step B41). In Step B41, a calculation is made by assigning the measured temperature (Tlsr) to the function F (Tlsr) which is saved in advance in a memory storage in the control means F1. This function F (Tlsr) is made as a function from the relation of the temperature measured by the apparatus temperature detection unit and the temperature of the optimal wavelength conversion element at which the light output from the laser light source unit LH can be made the maximum. This function F (Tlsr) is made as a function from the relation of the apparatus temperature and the optimal temperature of the wavelength conversion element. Specifically, in a certain apparatus temperature (surrounding temperature of the semiconductor laser), as shown in FIGS. 10 and 11, the setting temperature of the wavelength conversion element is changed, and the amount of electric power supplied to the heating unit 7 at each setting temperature is measured when the wavelength conversion element 5 is irradiated with laser light, thereby obtaining temperature at which the amount of electric power supply turns into a maximum, whereby the temperature is set as first optimal setting temperature in the apparatus temperature. This operation is carried out at each apparatus temperature, and the relation of the above-mentioned optimal setting temperature with respect to each apparatus temperature is obtained, thereby making this as function.

A result (Y) obtained in the operation of Step B42, is the optimal temperature (PPLN temperature) at which the light output from semiconductor laser can be maximized, so that this is set as a preset value of the temperature of the wavelength conversion element (Step B43). Thus, by operating it according to the flow chart shown in FIG. 15, the temperature of the wavelength conversion element can be set as the optimal value at which the light output from the laser light source unit LH may become the maximum to change of the apparatus temperature. Where the surrounding temperature etc. gradually changes after the beginning of lighting etc., it is desirable to apply the present embodiment to, for example, case where the ambient environment changes relatively early. The series of processing is periodically performed in the middle of lighting of laser, and preferably performed at a frequency of once a second or once a minute.

Although the laser light source apparatus according to the present embodiment is installed, for example, in an image apparatus, the setting temperature of the wavelength conversion element is updated in the midst of an actual operation of the laser light source apparatus in the image apparatus, as set forth below. The predetermined apparatus temperature (for example, temperature TL1 of FIG. 13) and the actually measured value of the present apparatus temperature are compared with each other, and for example, if the actually measured value of apparatus temperature is higher than temperature (TL1) by 1 degree Celsius, it is applied to the previously saved function which shows the relationship, whereby the setting temperature of the wavelength conversion element 5 is updated as a value which is, by a predetermined value (for example, 0.1 degree Celsius), higher than the optimal value which is saved in the memory.

In addition, although the setting temperature may be updated by calculation in real time by a processing unit such as a microcomputer, using the expression of relations mentioned above, for the convenience of the operation processing speed of the processing unit, before lighting of the semiconductor laser is started, calculation is made in advance using the above-described relational expression etc., whereby Table 1 shown below may be created and stored in the memory storage. And the optimal setting temperature is updated referring to this table during an operation of the apparatus.

TABLE 1

| Apparatus temperature (degrees Celsius) | PPNN Heater Setting Temperature (Optimal Temperature) degrees Celsius |
|---|---|
| 24.0 | 79.9 |
| 25.0 (TL1) | 80.0 |
| 26.0 | 80.1 |
| 27.0 | 80.2 |
| 28.0 | 80.3 |

According to the present embodiment, as described above, since arithmetic processing of the function can be performed in real time so that the setting temperature may be updated periodically even during projection of an image, the setting temperature of the wavelength conversion element 5 can always be corrected so as to be the optimal temperature. Although the temperature of the semiconductor laser lighting apparatus changes little by little depending on the conditions under operation, according to the present embodiment, even under an operation of the apparatus, the optimal setting temperature of the wavelength conversion element can be updated according to change of such conditions.

REFERENCE SIGNS LIST

1 Substrate
2 Semiconductor Laser
3 Shielding Container
4 Base Wave Light Reflecting Element (VBG)
5 Wavelength Conversion Element (PPLN)
6 Heat Exchanger Plate
7 Heating Unit (Heater)
8 Dichroic Mirror
9 Reflective Mirror
10 Dichroic Output Mirror
11 Beam Dump
20 Lightning Circuit
21 Control Unit
21a Optimal temperature setting unit
21b Temperature control unit
21c Optimal temperature sequential setting unit
31 Setting temperature Updating Unit
33 Oscilloscope
32 Optical Power Meter
Th1 Temperature detection unit
Th2 Apparatus temperature detection unit
LH Laser light source unit
U1 Electric supply circuit
U2 Pulse circuit
U3 Drive circuit
F1 Control unit
M1 DC power supply
Q1, Q2, Q3 Switching elements
L1 Choke coil
C1 Smoothing capacitor
C2 Capacitor group
D1 Flywheel diode
G1, G2, G3 Gate drive circuits
I1 Electric supply current detection unit
V1 Electric supply voltage detection unit

The invention claimed is:

1. A laser light source apparatus comprising:
   a semiconductor laser;
   a lighting circuit, which lights the semiconductor laser;
   a wavelength conversion element which carries out wavelength conversion of laser light emitted from the semiconductor laser;
   a detection unit which detects the temperature of the wavelength conversion element;
   a heating unit which heats the wavelength conversion element;
   a control unit which controls the lighting circuit and the heating unit,
wherein the control unit has a temperature control unit which controls the amount of electric supply to the heating unit based on a difference between temperature detected by the detection unit and a setting temperature, and which performs control so that the temperature of the wavelength conversion element turns into the setting temperature;

an optimal temperature setting unit which, without using an output from the wavelength conversion element, obtains an optimal setting temperature at which the amount of electric power supplied to the heating unit turns into a local maximum, based on the amount of electric power supplied to the heating unit at each setting temperature measured while changing the setting temperature when the wavelength conversion element is irradiated with laser light, wherein the control unit controls the lighting circuit and the heating unit so that the temperature of the wavelength conversion element turns into the optimal setting temperature.

2. A laser light source apparatus according to claim 1, further comprising an apparatus temperature detection unit which detects the temperature of the semiconductor laser or the temperature of a substrate where the semiconductor laser is provided, the control unit further including an optimal temperature sequential setting unit, which calculates a setting temperature compensation amount with respect to the optimal setting temperature by using apparatus temperature and/or condition of electric power applied to the laser, as a parameter, and which periodically and sequentially corrects the setting temperature to the optimal setting temperature.

3. A method for controlling temperature of a wavelength conversion unit in a laser light source apparatus comprising a semiconductor laser; a lighting circuit, which lights the semiconductor laser; a wavelength conversion element which carries out wavelength conversion of laser light emitted from this semiconductor laser; a detection unit which detects the temperature of the wavelength conversion element; and a heating unit which heats the wavelength conversion element, wherein the amount of electric power supplied to the heating unit is controlled based on a difference of temperature detected by the detection unit and setting temperature, and control is performed so that the temperature of the wavelength conversion element turns into the setting temperature, comprising the following steps of:

a first step of measuring the amount of electric power supplied to the heating unit at each setting temperature while changing the setting temperature when the wavelength conversion element is irradiated with laser light, and, without using an output from the wavelength conversion element, obtaining the temperature at which the amount of electric power supply supplied to the heating unit turns into a local maximum, based on the measured amount of electric power supplied to the heating unit at each setting temperature, and setting the temperature as an optimal setting temperature;

a second step of setting the temperature as the optimal setting temperature; and a third step of controlling the amount of electric power supplied to the heater so that the temperature of the wavelength conversion element turns into the optimal setting temperature.

4. A method for controlling temperature of the wavelength conversion unit in a laser light source apparatus according to claim 3, further comprising a step of detecting the apparatus temperature which is the temperature of the semiconductor laser or the temperature of a substrate where the semiconductor laser is provided; setting the temperature set in the first step as a first optimal setting temperature in the apparatus temperature; calculating a setting temperature compensation amount by making, as a parameter, apparatus temperature or conditions of the electric power added to laser at different apparatus temperature therefrom; and a step of periodically and sequentially correcting the setting temperature set in the second step to the optimal setting temperature.

* * * * *